(12) United States Patent
Shirakawa et al.

(10) Patent No.: US 10,050,105 B2
(45) Date of Patent: Aug. 14, 2018

(54) SEMICONDUCTOR DEVICE

(71) Applicant: FUJI ELECTRIC CO., LTD., Kanagawa (JP)

(72) Inventors: Tohru Shirakawa, Matsumoto (JP); Tatsuya Naito, Matsumoto (JP); Isamu Sugai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 18 days.

(21) Appl. No.: 15/364,178

(22) Filed: Nov. 29, 2016

(65) Prior Publication Data

US 2017/0200784 A1 Jul. 13, 2017

(30) Foreign Application Priority Data

Jan. 12, 2016 (JP) .................................. 2016-003515

(51) Int. Cl.
*H01L 29/49* (2006.01)
*H01L 29/06* (2006.01)
(Continued)

(52) U.S. Cl.
CPC ...... *H01L 29/0634* (2013.01); *H01L 21/2252* (2013.01); *H01L 21/324* (2013.01); *H01L 27/0629* (2013.01); *H01L 27/088* (2013.01); *H01L 29/0638* (2013.01); *H01L 29/0834* (2013.01); *H01L 29/1095* (2013.01); *H01L 29/402* (2013.01); *H01L 29/408* (2013.01); *H01L 29/7397* (2013.01); *H01L 29/7803* (2013.01); *H01L 29/7805* (2013.01);
(Continued)

(58) Field of Classification Search
CPC ............. H01L 29/0634; H01L 21/2252; H01L 21/324
See application file for complete search history.

(56) References Cited

U.S. PATENT DOCUMENTS

2002/0153586 A1 10/2002 Majumdar et al.
2007/0272953 A1* 11/2007 Hirler ................. H01L 29/0634
257/285
(Continued)

FOREIGN PATENT DOCUMENTS

JP H04-354156 A 12/1992
JP 2007-335844 A 12/2007

*Primary Examiner* — Michael Shingleton

(57) ABSTRACT

To provide an optimal structure for electrically connecting an MOSFET region, a FWD region, and an IGBT region in parallel within one semiconductor chip by mitigating electric field concentration between a SJ column and a drift region, a semiconductor device is provided, the semiconductor device including: a semiconductor substrate: a super junction MOSFET having a repetitive structure of a first column and a second column; a parallel device having a drift region including second conductivity-type impurities, and being provided separately from the super junction MOSFET in the semiconductor substrate; and a boundary portion located between the super junction MOSFET and the parallel device in the semiconductor substrate, wherein the boundary portion extends from one main surface side to the other main surface side, and has at least one third column having first conductivity-type impurities, and the third column is shallower than the first column and the second column.

13 Claims, 24 Drawing Sheets

(51) Int. Cl.
  *H01L 21/225*  (2006.01)
  *H01L 21/324*  (2006.01)
  *H01L 29/10*   (2006.01)
  *H01L 29/40*   (2006.01)
  *H01L 29/78*   (2006.01)
  *H02M 7/537*   (2006.01)
  *H01L 29/739*  (2006.01)
  *H01L 29/08*   (2006.01)
  *H01L 27/06*   (2006.01)
  *H01L 27/088*  (2006.01)
  *H01L 21/266*  (2006.01)
  *H02M 7/00*    (2006.01)
  *H01L 21/8234* (2006.01)

(52) U.S. Cl.
  CPC ...... *H01L 29/7811* (2013.01); *H01L 29/7813* (2013.01); *H02M 7/537* (2013.01); *H01L 21/2253* (2013.01); *H01L 21/266* (2013.01); *H01L 21/823418* (2013.01); *H01L 21/823487* (2013.01); *H02M 7/003* (2013.01)

(56) References Cited

U.S. PATENT DOCUMENTS

2012/0153348 A1  6/2012  Aono et al.
2014/0070266 A1  3/2014  Matsudai et al.

\* cited by examiner

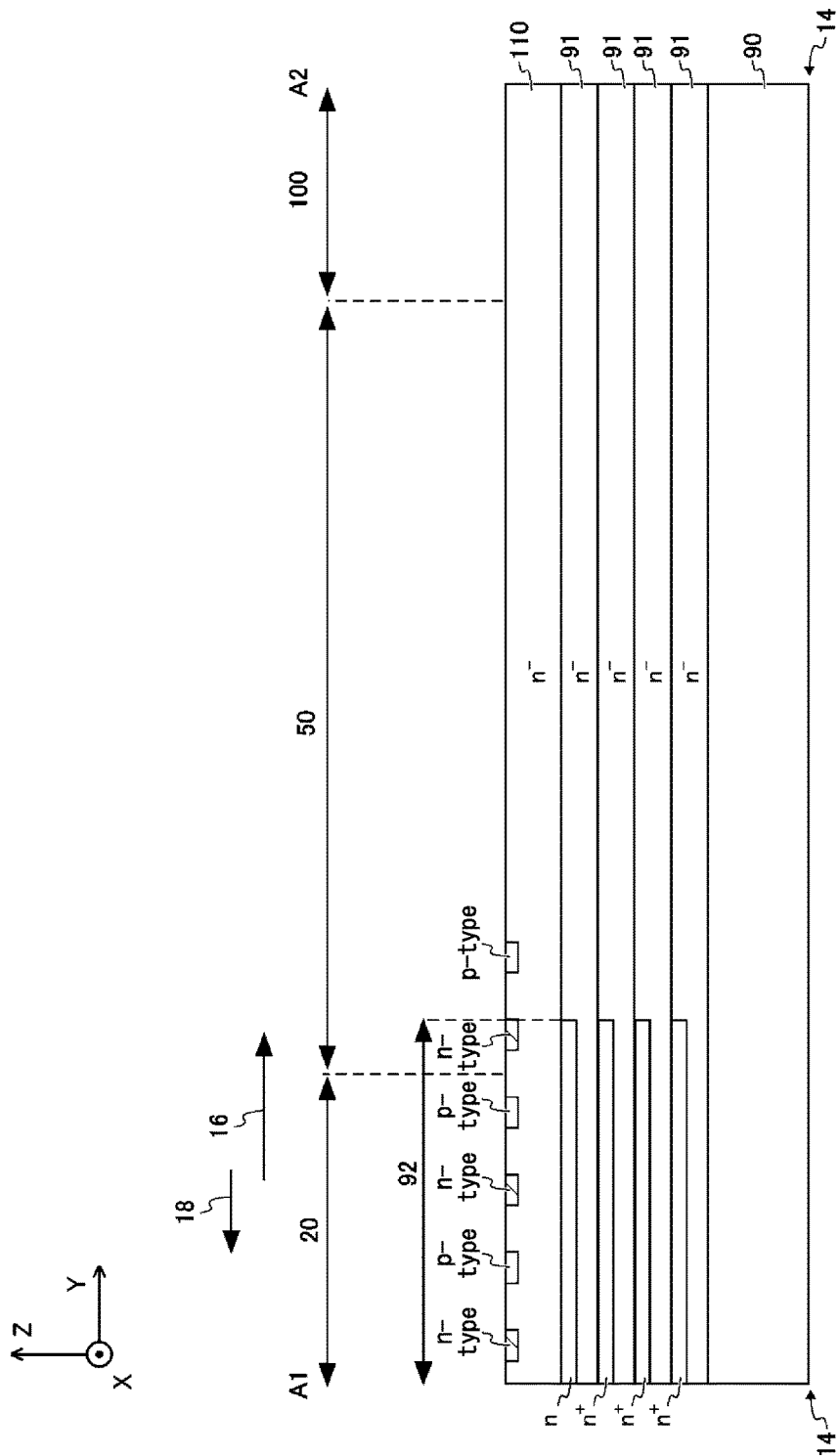

SEMICONDUCTOR DEVICE

The contents of the following Japanese patent application are incorporated herein by reference:
NO. 2016-003515 filed in JP on Jan. 12, 2016.

BACKGROUND

1. Technical Field

The present invention relates to a semiconductor device.

2. Related Art

Conventionally, an IGBT (Insulated Gate Bipolar Transistor) chip and an MOSFET (Metal-Oxide-Semiconductor Field-Effect Transistor) chip having an internal parasitic diode have been electrically connected, and an IGBT, an MOSFET, and a diode have been connected in parallel (refer to, for example, Patent Document 1). Also, an RC-IGBT having the IGBT and a FWD (Free Wheeling Diode) has been known (refer to, for example, Patent Document 2). Further, it has been known that a boundary region is provided between an IGBT region and a FWD region (refer to, for example, Patent Document 3). Also, it has been known that a trench having an insulating body is provided between the IGBT region and the FWD region (refer to, for example, Patent Document 4). Furthermore, it has been known to provide, between an element region and a terminal end, p-type and n-type pillar regions of which the depths become shallow from the element region to the terminal end in a step-by-step manner (refer to, for example, Patent Document 5).

PRIOR ART DOCUMENTS

Patent Document 1: Japanese Patent Application Publication No. H04-354156
Patent Document 2: Japanese Patent Application Publication No. 2012-142537
Patent Document 3: Japanese Patent Application Publication No. 2014-056942
Patent Document 4: Japanese Patent Application Publication No. 2002-314082
Patent Document 5: Japanese Patent Application Publication No. 2007-335844

It has been required to provide, within one semiconductor chip, the MOSFET region, the FWD region, and the IGBT region electrically connected in parallel. In a case where the MOSFET region is a super junction (hereinafter abbreviated as SJ) MOSFET, it realizes a higher breakdown voltage than a non-SJ MOSFET. However, due to a difference in impurity concentrations between an SJ column of the SJ MOSFET and a drift region of the FWD region or the IGBT region adjacent to the SJ MOSFET, an electric field concentrates between the SJ column and the drift region, generating an avalanche current. For that reason, in a case where the MOSFET region, the FWD region, and the IGBT region are provided in one semiconductor chip, a semiconductor device with high breakdown voltage could not be obtained.

SUMMARY

Therefore, an optimal structure is provided for electrically connecting the MOSFET region, the FWD region, and the IGBT region in parallel within one semiconductor chip by mitigating the electric field concentration between the SJ column and the drift region.

In a first aspect of the present invention, a semiconductor substrate, a super junction MOSFET, a parallel device, and a boundary portion are provided. The super junction MOSFET may have a repetitive structure of a first column and a second column. The first column and the second column may be provided, each extending from one main surface side to the other main surface side of the semiconductor substrate. The first column may have first conductivity-type impurities. The second column may have second conductivity-type impurities. The parallel device may have a drift region including second conductivity-type impurities. The parallel device may be provided separately from the super junction MOSFET in the semiconductor substrate. The boundary portion may be located between the super junction MOSFET and the parallel device in the semiconductor substrate. The boundary portion may have at least one third column. The third column may extend from the one main surface side to the other main surface side. The third column may have first conductivity-type impurities. A depth of the third column may be shallower than that of the first column and that of the second column.

The boundary portion may have a plurality of third columns in different positions of the semiconductor substrate in an outer direction directed from the super junction MOSFET toward the parallel device. The depth of the plurality of the third columns may be gradually shallower toward the outer direction.

The semiconductor device may further include a fourth column between the third columns adjacent to each other of the plurality of the third columns. The fourth column may have second conductivity-type impurities. A concentration of the second conductivity-type impurities of the fourth column may be equal to greater than a concentration of the second conductivity-type impurities in the drift region. A concentration of the first conductivity-type impurities in the plurality of the third columns may be equal to greater than the concentration of the second conductivity-type impurities in the drift region.

A depth of the fourth column may be smaller than the depth of the third column adjacent thereto in a reverse direction of the outer direction. The third column may have a protruding region. The protruding region may protrude in the outer direction at a bottom of the third column.

The protruding region may not contact the fourth column adjacent thereto in the outer direction.

The depth of the fourth column may be equal to the depth of the third column adjacent thereto in the outer direction.

The boundary portion may have two sets of the third column and the fourth column having the same depth consecutively in the outer direction at an end portion of the outer direction.

The super junction MOSFET may further include a buffer region at the other main surface side. The buffer region may have second conductivity-type impurities. An end portion at a side of the boundary portion of the buffer region may be located away from the first column and the second column which are the closest to the boundary portion, the first column and the second column being provided in the super junction MOSFET.

The super junction MOSFET may further include a base region, a source region, a surface region and a first isolation trench. The base region may be located on the repetitive structure of the first column and the second column. The base region may have first conductivity-type impurities. The source region may include a portion of an outermost surface of the base region. The source region may have second conductivity-type impurities. The source electrode may be electrically connected to the source region. The source electrode may be provided on the base region. The surface region may be provided in a region which is on an outermost surface of the base region, and is different from the source region. The surface region may be electrically connected to the source electrode provided on the base region. The surface region may have a concentration of the second conductivity-type impurities lower than that of the source region. The first isolation trench may extend downward from a portion of the surface region. The first isolation trench may extend until it reaches a boundary between the second column and the first column adjacent to the second column.

The boundary portion may include a base region, a surface region, and a second isolation trench. The base region may be provided extending from the super junction MOSFET. The surface region may be provided extending from the super junction MOSFET. The second isolation trench may be provided extending downward from a portion of the surface region. The second isolation trench may be provided extending until it reaches any of the third column, the fourth column, and the boundary between the third column and the fourth column adjacent to each other.

The parallel device may be either one of a freewheeling diode and the IGBT.

The parallel device may be the freewheeling diode. The semiconductor device may further include the IGBT and an edge termination structure. The IGBT may be adjacent to the freewheeling diode in the outer direction directed from the super junction MOSFET toward the freewheeling diode. The edge termination structure may be adjacent to the IGBT in the outer direction. The super junction MOSFET, the boundary portion, the freewheeling diode, and the IGBT may be provided in the semiconductor substrate which is a single substrate.

The summary clause does not necessarily describe all necessary features of the embodiments of the present invention. The present invention may also be a sub-combination of the features described above.

BRIEF DESCRIPTION OF THE DRAWINGS

FIG. 4C is a view illustrating a step of forming a first layer of n-type and p-type impurity regions of a drift region 110.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

Figure 1:
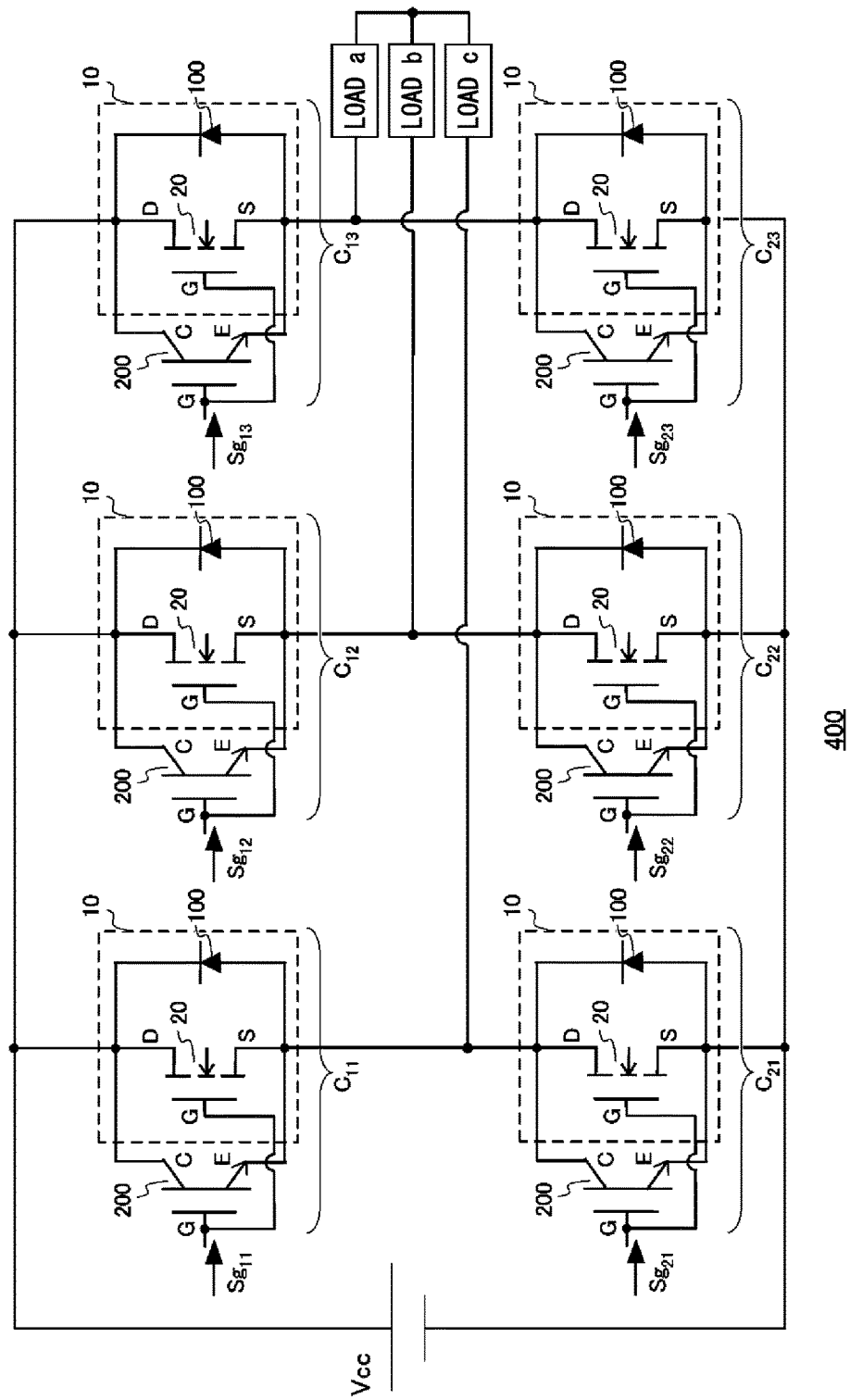
FIG. 1 is a view illustrating an example of the inverter apparatus 400.

FIG. 1 is a view illustrating an example of an inverter apparatus 400. The inverter apparatus 400 of the present example has a direct current power source Vcc, six circuit blocks $C_{xy}$ (x and y are each natural numbers from 1 to 3), and loads a to c. The circuit blocks $C_{11}$ and $C_{21}$ are serially connected to constitute a first arm. Similarly, the circuit blocks $C_{12}$ and $C_{22}$ are serially connected to constitute a second arm, and the circuit blocks $C_{13}$ and $C_{23}$ are serially connected to constitute a third arm. The first arm, the second arm, and the third arm are connected to each other in parallel. A drain terminal (D) and a collector terminal (C) of the circuit blocks $C_{11}$, $C_{12}$, and $C_{13}$ are connected to a positive potential of Vcc. A source terminal (S) and an emitter terminal (E) of the circuit blocks $C_{21}$, $C_{22}$, and $C_{23}$ are connected to a negative potential of Vcc.

In the present example, each semiconductor substrate 10 is provided with one circuit block $C_{xy}$. Each of the circuit blocks $C_{xy}$ includes an IGBT 200, an SJ MOSFET 20, and an FWD 100, each being connected in parallel. A gate (G) of the SJ MOSFET 20 and the IGBT 200 is electrically connected to each other. A gate signal $Sg_{xy}$ is input to a gate (G) of one circuit block $C_{xy}$ from outside. Thereby, the gate (G) is turned ON or OFF. That is, each of the circuit blocks $C_{xy}$ is turned ON or OFF.

For the sake of description, in a case where $C_{xy}$ at a positive potential side of Vcc is turned ON and $C_{xy}$ at a negative potential side of Vcc is turned OFF in one arm, the one arm is described as H (abbreviation for High). Meanwhile, in a case where $C_{xy}$ at the positive potential side of Vcc is turned OFF and $C_{xy}$ at the negative potential side of Vcc is turned ON in one arm, the one arm is described as L (abbreviation for Low). In the present example, (the first arm, the second arm, the third arm) undergoes a change in the order of (H, L, L), (H, H, L), (L, H, L), (L, H, H), (L, L, H), and (H, L, H), and then further returns to (H, L, L). In this way, electric current of a three-phase alternating current can flow through the loads a to c using the direct current power source Vcc by appropriately turning on or off each circuit block $C_{xy}$.

For example, at certain timing, the circuit block $C_{11}$ is turned ON by $Sg_{11}$, the circuit block $C_{22}$ is turned ON by $Sg_{22}$, and the circuit block $C_{23}$ is turned ON by $Sg_{23}$. At this time, the circuit blocks $C_{21}$, $C_{12}$, and $C_{13}$ are turned OFF. Thereby, (the first arm, the second arm, the third arm) achieves (H, L, L).

Also, for example, at different timing, the circuit block $C_{11}$ is turned ON by $Sg_{11}$, the circuit block $C_{12}$ is turned ON by $Sg_{12}$, and the circuit block $C_{23}$ is turned ON by $Sg_{23}$. At this time, the circuit blocks $C_{21}$, $C_{22}$, and $C_{13}$ are turned OFF. Thereby, (the first arm, the second arm, the third arm) achieves (H, H, L).

Figure 2:
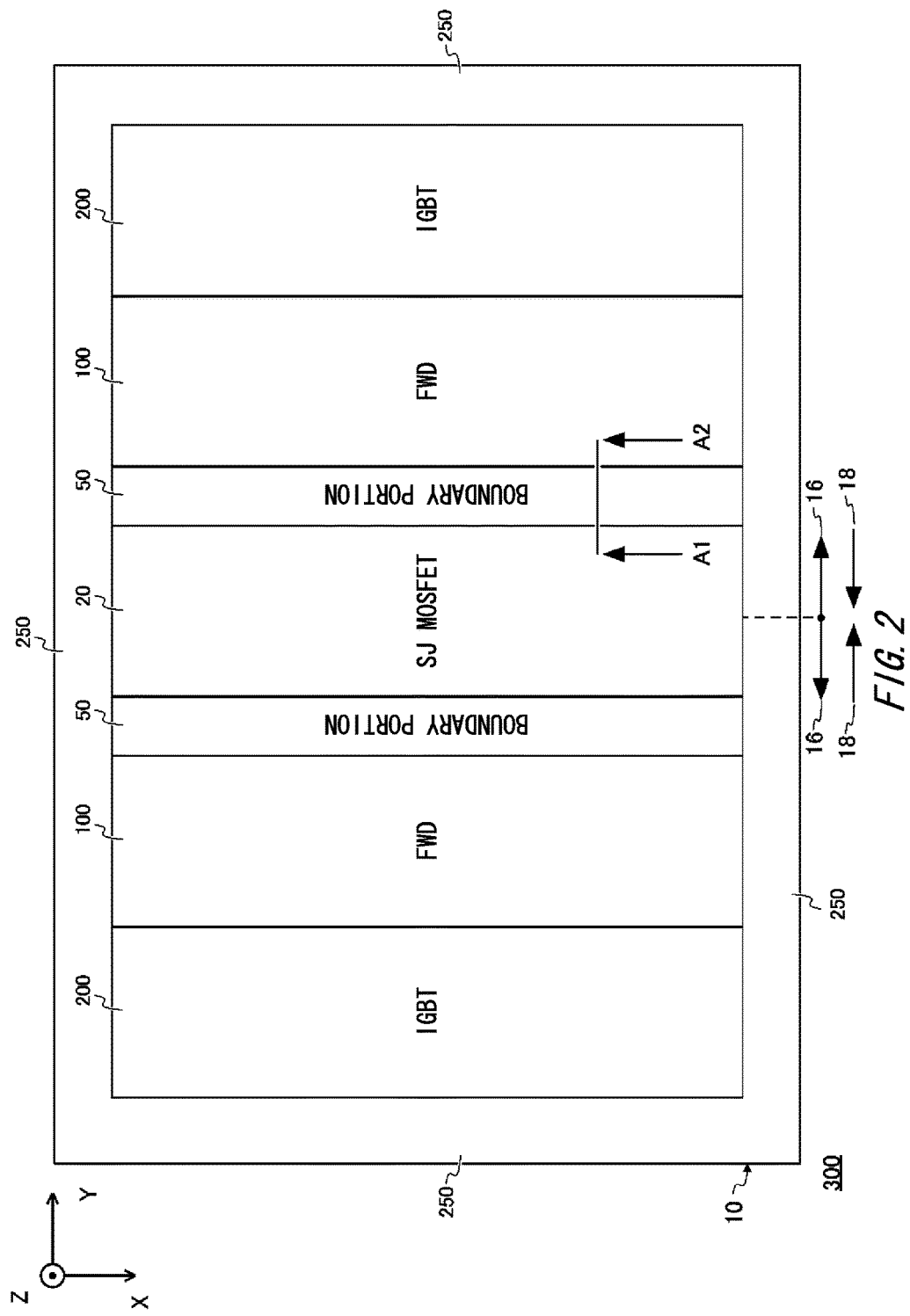
FIG. 2 is a schematic view illustrating an upper surface of a semiconductor substrate 10 in a first embodiment.

FIG. 2 is a schematic view illustrating an upper surface of a semiconductor substrate 10 in a first embodiment. The semiconductor substrate 10 of the present example has one main surface parallel to an X-Y plane. A semiconductor device 300 of the present example is formed on the semiconductor substrate. In the present example, the semiconductor device 300 has the SJ MOSFET 20, the boundary portion 50, the FWD 100, the IGBT 200, and an edge termination structure 250.

The SJ MOSFET 20 of the present example is provided in a central portion of the semiconductor substrate 10. The boundary portion 50 has a function of mitigating electric field concentration between the SJ MOSFET 20 and the parallel device. Also, the boundary portion 50 is provided adjacent to ±Y direction of the SJ MOSFET 20.

The parallel device is provided adjacent to the boundary portion 50. For that reason, the SJ MOSFET 20, the boundary portion 50, and the parallel device are arranged in this order. The parallel device may be either the FWD 100 or the IGBT 200. In the present example, the parallel device corresponds to the FWD 100. In the present example, the direction directed from the SJ MOSFET 20 toward the FWD 100 is taken as an outer direction 16. The direction opposite to the outer direction 16 is taken as an inner direction 18.

The other parallel device is further provided adjacent to the parallel device in the outer direction 16. The other parallel device may be an element different from the parallel device adjacent thereto. The other parallel device may be the other one of the FWD 100 or the IGBT 200. In the present example, the other parallel device corresponds to the IGBT 200.

In addition, in other examples, the parallel device may be the IGBT 200, and the other parallel device may be the FWD 100. That is, each element of the SJ MOSFET 20, the boundary portion 50, the IGBT 200, and the FWD 100 may be provided in this order from the central portion toward the outer direction 16.

The FWD 100 and the IGBT 200 easily generates heat during operation compared to the SJ MOSFET 20. In a case where heat is not appropriately dissipated, the elements are likely to be broken due to thermal runaway. In the present example, the FWD 100 and the IGBT 200 are provided further on the outer side, in the outer direction 16, than the SJ MOSFET 20 is. Thereby, heat of the FWD 100 and the IGBT 200 can be released in the outer direction 16 of the chip more efficiently compared to a case where the SJ MOSFET 20 is located closer to the outer direction 16 than the FWD 100 and the IGBT 200 are.

In the present example, the edge termination structure 250 is provided adjacent to the outer direction 16 of the IGBT 200. The edge termination structure 250 may be adjacent to an end portion of ±X direction of an element region including the SJ MOSFET 20, the boundary portion 50, the FWD 100, and the IGBT 200. That is, the edge termination structure 250 may be provided so as to surround the element region. The edge termination structure 250 has a function of improving breakdown voltage of the semiconductor substrate 10 compared to a case where the edge termination structure 250 is not present. The edge termination structure 250 has a function of mitigating electric field concentration by expanding a depletion layer during the application of high voltage. Specifically, the edge termination structure 250 may have one or more of a guard ring and a field plate provided so as to surround the element region.

Figure 3:
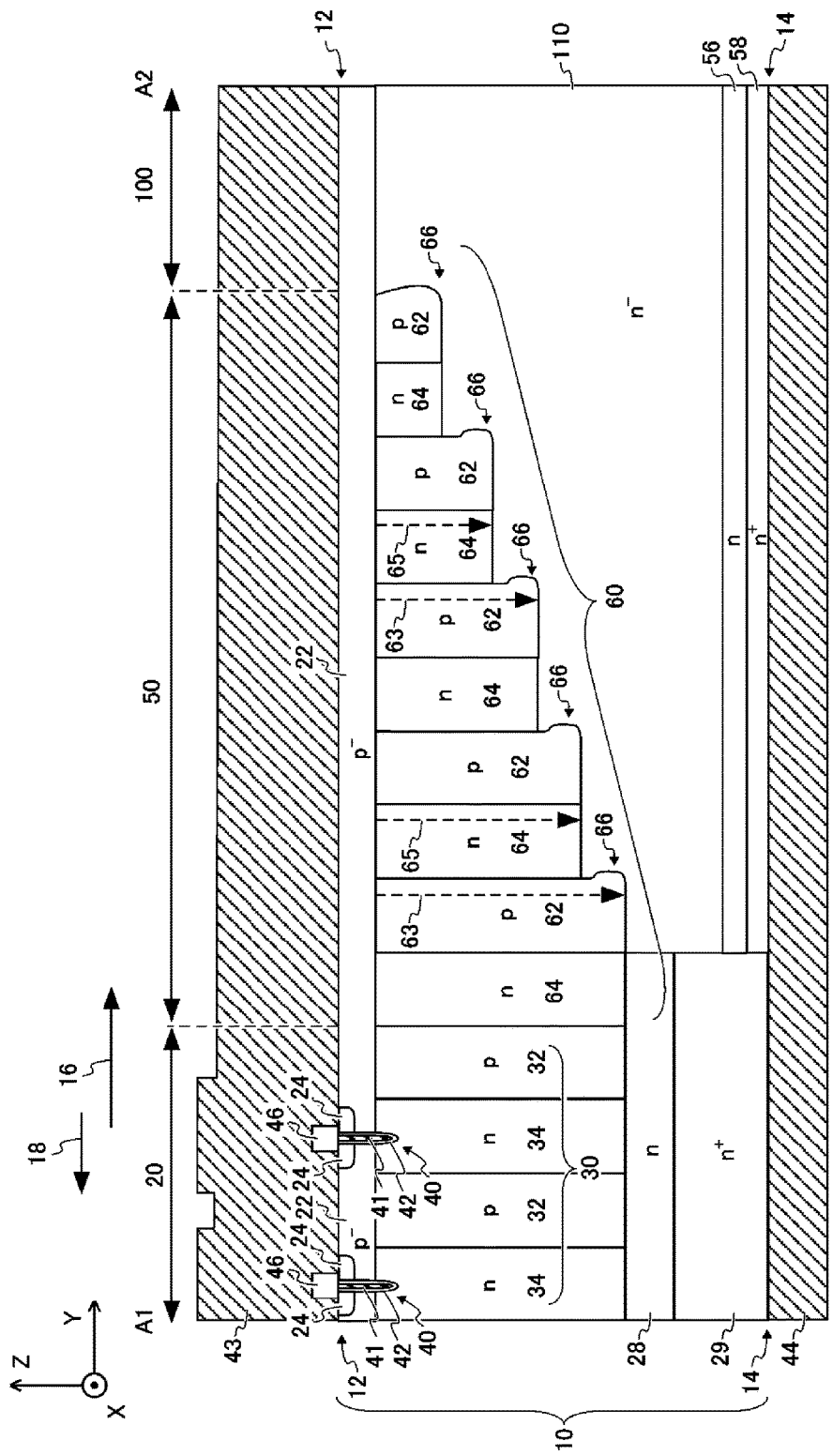
FIG. 3 is a schematic view illustrating a cross section along A1-A2 in the first embodiment.

FIG. 3 is a schematic view illustrating a cross section along A1-A2 in the first embodiment. As shown in FIG. 3, the semiconductor device 300 includes the SJ MOSFET 20, the FWD 100, and the boundary portion 50. The parallel device is provided separately from the SJ MOSFET 20 in the semiconductor substrate 10, and has a drift region 110 including n-type impurities.

The semiconductor substrate 10 of the present example has one main surface 12 and the other main surface 14. In the semiconductor substrate 10, the SJ MOSFET 20, the boundary portion 50, and the FWD 100 may share a source electrode 43, a p-type base region 22, and a drain electrode 44. The source electrode 43 may be electrically connected to a source terminal (S) of the circuit block $C_{xy}$. The drain electrode 44 may be electrically connected to a drain terminal (D) of the circuit block $C_{xy}$.

In the present specification, the expressions "on" and "over" mean positions of +Z direction. Meanwhile, the expressions "under", "below", and "bottom" mean the position of −Z direction. In the present specification, X direction and Y direction are directions vertical to each other, and Z direction is a direction vertical to the X-Y plane. The X direction, the Y direction, and the Z direction makes a so-called right-handed system. In addition, the Z direction does not necessarily mean a direction vertical to the ground. The +Z direction of the present example is a direction directed from the drain electrode 44 toward the source electrode 43. Also, the X-Y plane of the present example is a direction parallel to one main surface 12 and the other main surface 14.

Also, in the present specification, "n" and "p" mean that the electrons and holes serve as majority carriers, respectively. Also, the superscript "+" means a higher carrier concentration when added than when not added, and the superscript "−" means a lower carrier concentration when added than when not added. In the present specification, the first conductivity-type is taken as a p-type, and the second conductivity-type is taken as an n-type. However, in other examples, the first conductivity-type and the second conductivity-type may be taken as n-type and p-type, respectively.

(SJ MOSFET 20) The SJ MOSFET 20 of the present example has a drain region 29, a buffer region 28, a repetitive structure 30, and a base region 22, in order from down to up.

The drain region 29 has $n^+$-type impurities of the second conductivity-type. The drain region 29 may have a concentration of n-type impurities of $1E+17$ $[cm^{-3}]$ or more and $1E+21$ $[cm^{-3}]$ or less. The buffer region 28 has n-type impurities of the second conductivity-type. The buffer region 28 may have a concentration of n-type impurities of $1E+14$ $[cm^{-3}]$ or more and $1E+15$ $[cm^{-3}]$ or less. In addition, in the present specification, E means power of 10, and for example, E+16 means $10^{16}$, and E-16 means $10^{-16}$.

The base region 22 has p⁻-type impurities of the first conductivity-type. The base region 22 is located on the repetitive structure 30. The base region 22 may have a concentration of p-type impurities of E+16 [cm⁻³] or more and E+20 [cm⁻³] or less, and more preferably, E+16 [cm⁻³] or more and E+18 [cm⁻³] or less. In a case where a predetermined positive potential is applied to a gate electrode 42, a channel region is formed in the base region 22 in the vicinity of a gate insulating film 41.

The repetitive structure 30 has a repetitive structure of a p-type column 32 as a first column having first conductivity-type impurities and a n-type column 34 as a second column having second conductivity-type impurities. The p-type column 32 and the n-type column 34 are alternately provided adjacent to each other in the outer direction 16. The p-type column 32 and the n-type column 34 are each provided extending from the side of the one main surface 12 to the side of the other main surface 14. The p-type column 32 may have a concentration of p-type impurities of 1E+14 [cm⁻³] or more and 1E+17 [cm⁻³] or less. The n-type column 34 may have a concentration of n-type impurities of 1E+14 [cm⁻³] or more and 1E+17 [cm⁻³] or less.

The SJ MOSFET 20 has a gate trench 40. A bottom of the gate trench 40 reaches the n-type column 34. The gate trench 40 has a gate insulating film 41 and the gate electrode 42. The gate insulating film 41 is a thin film of insulation formed in contact with side walls and the bottom of the gate trench 40. The gate electrode 42 is formed in contact with the gate insulating film 41. The gate electrode 42 of the present example is formed of conductive materials such as polysilicon or the like. The gate electrode 42 is electrically isolated from the source electrode 43 by an interlayer insulating film 46, and may be electrically connected to the gate terminal (G) of the circuit block $C_{xy}$.

The source region 24 has n⁺-type impurities of the second conductivity-type. The source region 24 includes a portion of an outermost surface of the base region 22. The outermost surface corresponds to the one main surface 12. The source region 24 of the present example is provided sandwiching the gate trench 40. The length in the Y direction of the source region 24 may be approximately 5 [μm]. The source region 24 is electrically connected to the source electrode 43 provided on the base region 22.

In a case where predetermined potential difference is applied between the source electrode 43 and the drain electrode 44, and predetermined positive potential is applied to the gate electrode 42, electric current Ic flows through the SJ MOSFET 20. In this case, the electric current Ic flows through from the drain electrode 44 into the source electrode 43 via the drain region 29, the buffer region 28, the n-type column 34, the channel region and the source region 24 in the base region 22, in this order. The state where the electric current Ic flows through is referred to as an on state.

(Boundary portion 50) The boundary portion 50 is located between the SJ MOSFET 20 and the FWD 100. The boundary portion 50 has a base region 22 provided extending from the SJ MOSFET 20. The boundary portion 50 has at least one p-type column 62 as a third column having first conductivity-type impurities under the base region 22. The boundary portion 50 of the present example has a plurality of p-type columns 62. Although the boundary portion 50 of the present example has five p-type columns 62, the number of the p-type columns 62 may not be limited to five.

The p-type column 62 extends from the side of the one main surface 12 to the side of the other main surface 14. The p-type column 62 which is the closest to the SJ MOSFET 20 may have the same depth as that of the p-type column 32 and n-type column 34 of the SJ MOSFET 20. However, the depth of other p-type columns 62 is shallower than that of the p-type column 32 and the n-type column 34 of the SJ MOSFET 20. In the present example, the depth of a plurality of p-type columns 62 is gradually shallowed toward the outer direction 16.

In addition, in the present example, the depth means a length from a start point going down to an end point of a layer, a film, a region, or a column, the start point being a lower end of the base region 22. When the depth is shallow, it means that the length from the start point to the end point below is short. As other expressions indicating that the depth is shallow, in a case where a plurality of columns is compared, the column whose end portion at the side of the other main surface 14 in the column (that is, the bottom) is closer to the side of the one main surface 12 may be determined that its depth is shallow.

A concentration of n-type impurities of the n-type column 64 may be equal to or greater than a concentration of n-type impurities in the drift region 110. Also, a concentration of p-type impurities in the plurality of p-type columns 62 may be equal to or greater than the n-type impurity concentration in the drift region 110. The p-type column 62 may have the p-type impurity concentration of 1E+15 [cm⁻³] or more and 1E+17 [cm⁻³] or less. The n-type column 64 may have the n-type impurity concentration of 1E+15 [cm⁻³] or more and 1E+17 [cm⁻³] or less. The drift region 110 may have the n-type impurity concentration of 1E+13 [cm⁻³] or more and 1E+15 [cm⁻³] or less.

In a case where the boundary portion 50 is not present, if the SJ MOSFET 20 is an ON state, a depletion layer spreads downward from the base region 22. In addition, in this case, the depletion layer spreads in the downward direction from the FWD 100 toward the SJ MOSFET 20. The impurity concentration of the drift region 110 of the FWD 100 is lower than a concentration of impurities of the repetitive structure 30 of the SJ MOSFET 20. For that reason, the depletion layer is more likely to spread in the drift region 110 than the repetitive structure 30. As a result, electric field concentrates in only a region near the bottom of the p-type column 32 located closest to the outer direction 16, generating avalanche current and making it easier to decrease breakdown voltage. Therefore, it becomes difficult to arrange the SJ MOSFET 20 and the FWD 100 within one chip in parallel.

Contrary to the above, the boundary portion 50 of the present example has a p-type column 62 which becomes gradually shallower in the outer direction 16. Thereby, electric field can be shared at each bottom of the p-type column 62 which becomes gradually shallower, enabling the depletion layer spreading from the FWD 100 to gradually spread downward in the inner direction 18, and thus, the breakdown voltage can be improved. For this reason, it is possible to prevent electric field from concentrating in only a region near the bottom of the p-type column 32 located at the outer most in the outer direction 16, and thus, no reduction in the breakdown voltage occurs. The FWD 100 is nothing more than one example of the parallel device, and the similar effect can also be obtained in a case where the IGBT 200 is provided in the position of the FWD 100 as well.

The boundary portion 50 further has a n-type column 64 as a fourth column having second conductivity-type impurities between the p-type columns 62 adjacent to each other of the plurality of the p-type columns 62. The depth of the n-type column 64 of the present example is equal to the depth of the p-type column 62 adjacent thereto in the outer direction 16. In addition, in the present example, when the depth is equal, it does not mean that the depths strictly match each other. When the depth is equal, there may be a gap of approximately ±5 [nm].

The depth 65 of the n-type column 64 is smaller than the depth 63 of the p-type column 62 adjacent thereto in a reverse direction of the outer direction 16. For that reason, the impurities at the bottom of the p-type column 62 adjacent to the n-type column 64 in its outer direction 16 easily diffuse toward the outer direction 16 since no diffusion of the n-type column 64 occurs. Thereby, the p-type column 62 has an protruding region 66 at the bottom protruding toward the outer direction 16. In addition, the protruding region 66 does not contact the n-type column 64 adjacent thereto in the outer direction 16.

Meanwhile, in a case where the depth of the p-type column 62 is the same as that of the n-type column 64 adjacent to the outer direction 16, the protruding region 66 is not present. For this reason, the depletion layer from the FWD 100 suppresses the spread at the bottom of the n-type column 64, the spread of the depletion layer becomes dull, thereby decreasing the breakdown voltage. The inclusion of the protruding region 66 by each p-type column 62 causes the distance between the bottom of the p-type column 62 and the bottom of its adjacent p-type column 62 in the boundary portion 50 to get closer. For that reason, at the bottom of the repetitive structure 60, the depletion layer is likely to spread. Therefore, in the present example, compared to a case where the p-type column 62 has the same depth as that of the n-type column 64 adjacent thereto in the outer direction 16, the breakdown voltage can be improved by forming the protruding region 66.

An n-type field stop layer (hereinafter referred to as FS layer 56) and the n-type layer 58 of $n^+$-type are commonly provided in the boundary portion 50 and the parallel device. The FS layer 56 has a function of preventing the depletion layer extending downward in the drift region 110 of the parallel device from reaching the n-type layer 58. In addition, in the FWD 100, a pn-junction diode is formed by the $p^-$-type base region 22 and the drift region 110.

Figure 4A:
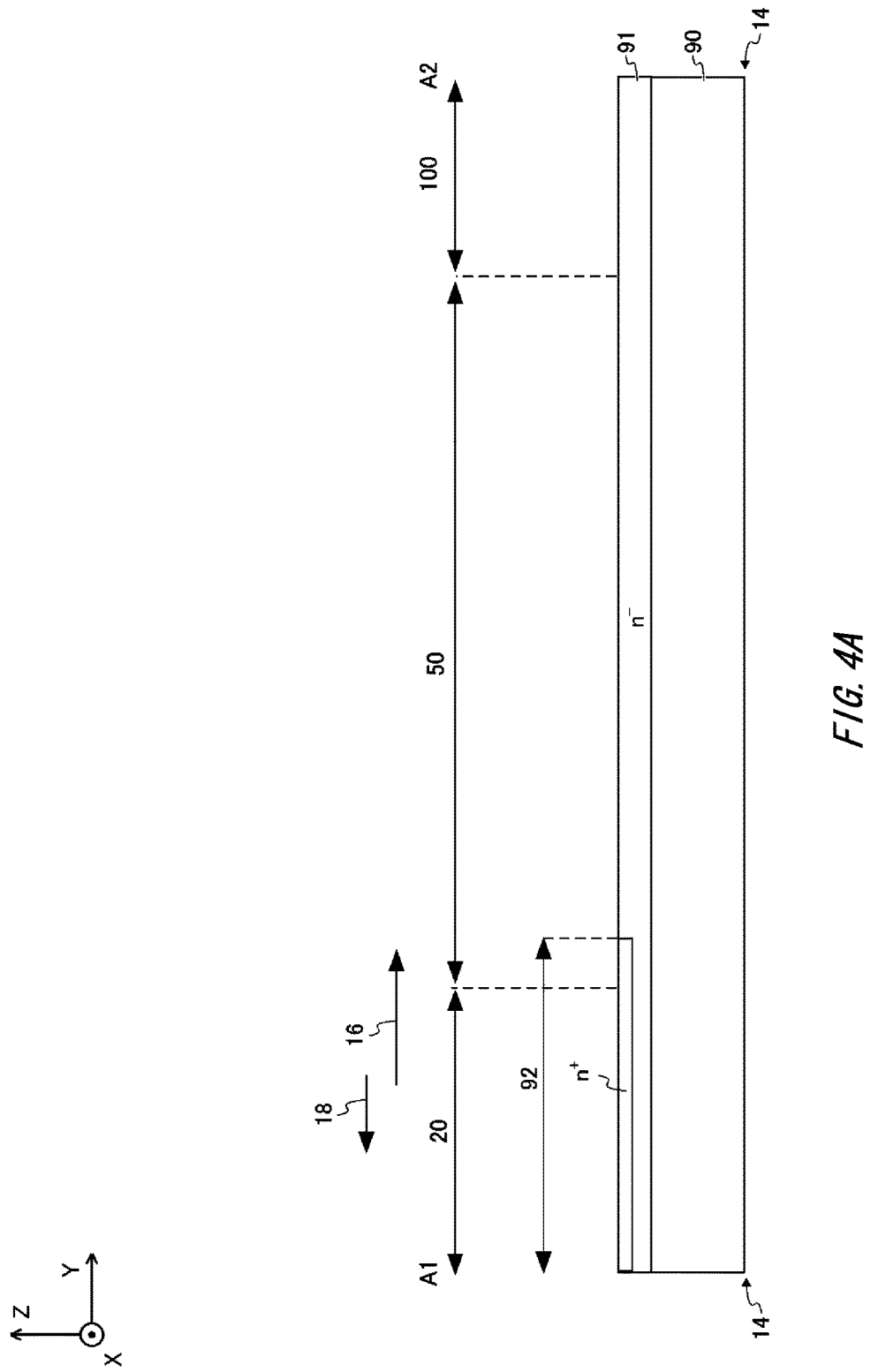
FIG. 4A is a view illustrating a step of forming a drain region 29.

FIG. 4A is a view illustrating the step of forming the drain region 29. First, one layer of epitaxial layer 91 is formed on a support substrate 90. The support substrate 90 may be a FZ substrate or an epitaxial substrate. Also, the impurity concentration of the support substrate 90 may be any value. The epitaxial layer 91 may be an n-type epitaxial layer having the same impurity concentration as that of the drift region 110. Subsequently, n-type impurities forming the drain region 29 are implanted into the region 92. The region 92 is also arranged within the boundary portion 50 arranged closer to the outer direction 16 than the SJ MOSFET 20 is.

Figure 4B:
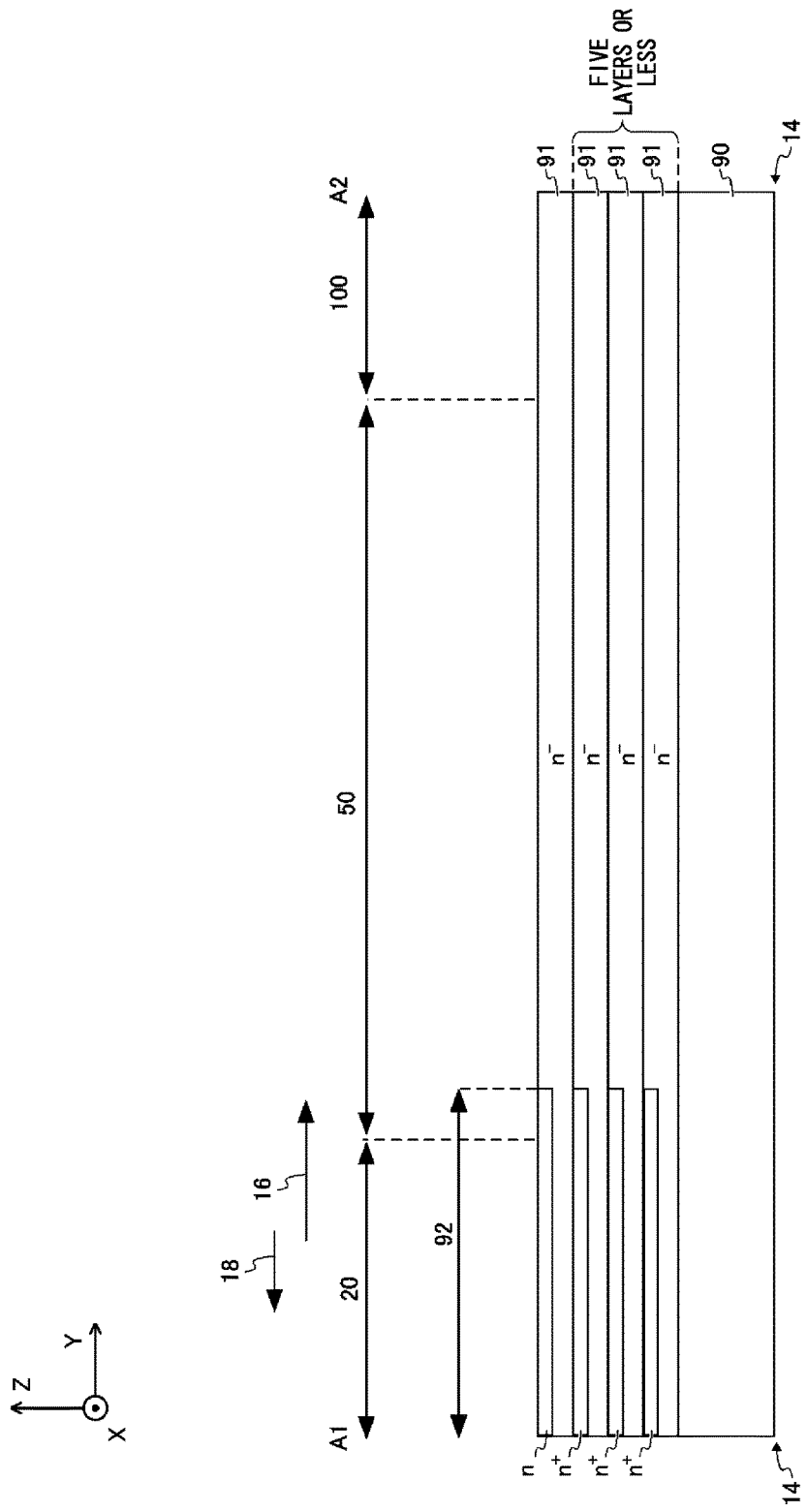
FIG. 4B is a view illustrating a step of forming the drain region 29 and a buffer region 28.

FIG. 4B is a view illustrating the step of forming the drain region 29 and the buffer region 28. The formation of the epitaxial layer on the epitaxial layer 91, and the implantation of the n-type impurities into the region 92 are repeatedly performed. The formation and implantation may be repeated five times or less. Subsequently, the epitaxial layer 91 is formed on the uppermost layer, and the n-type impurities forming the buffer region 28 are implanted into the region 92. The n-type impurity concentration of the region 92 forming the buffer region 28 may be lower than the n-type impurity concentration forming the drain region 29.

FIG. 4C is a view illustrating the step of forming a first layer of n-type and p-type impurity regions of the drift region 110. First, a common layer is formed in the SJ MOSFET 20, the boundary portion 50, and the FWD 100. In the present example, the common layer may be an n-type epitaxial layer which is the same as that of the drift region 110. Next, the n-type and p-type impurities are selectively implanted into the n-type epitaxial layer. In the SJ MOSFET 20, the n-type and p-type impurities are selectively implanted entirely to form the repetitive structure 30. Contrary to the above, in the boundary portion 50, the n-type and p-type impurities are selectively implanted only into a region closest to the SJ MOSFET 20 to form the repetitive structure 60.

Figure 4D:
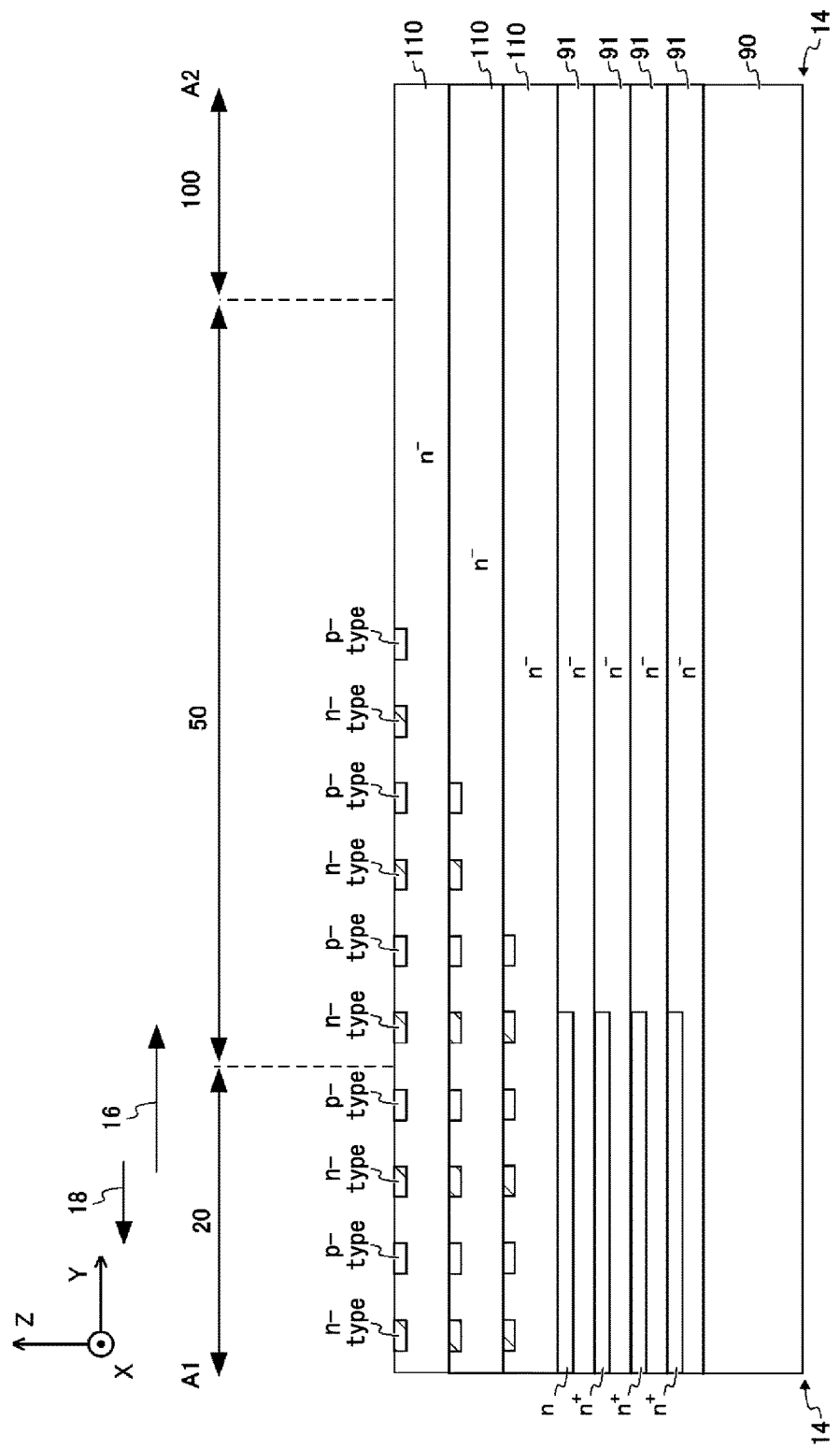
FIG. 4D is a view illustrating a step of forming a third layer of n-type and p-type impurity regions of the drift region 110.

FIG. 4D is a view illustrating the step of forming a third layer of n-type and p-type impurity regions of the drift region 110. Similar to the first layer, the formation of the n-type epitaxial layer and the selective implantation of the n-type and p-type impurities are repeated. However, in the boundary portion 50, as the number of layers increases, the region into which the n-type and p-type impurities are selectively implanted is increased toward the outer direction 16. At the first layer, a set of the n-type and p-type impurity regions is formed in only a region closest to the SJ MOSFET 20, whereas two sets and three sets of the n-type and p-type impurity regions are formed at the second layer and the third layer, respectively.

Figure 4E:
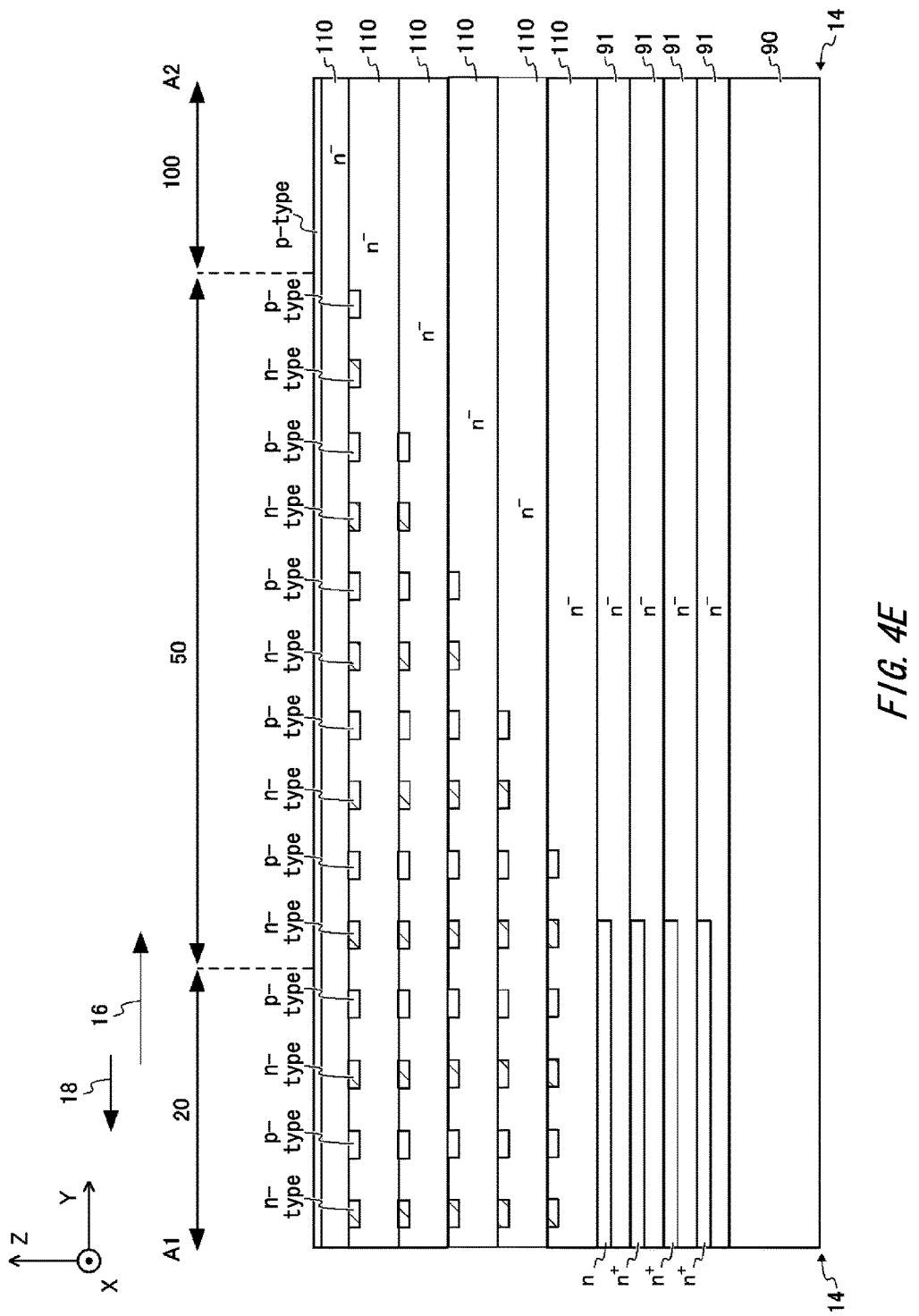
FIG. 4E is a view illustrating a step of forming a fifth layer of n-type and p-type impurity regions of the drift region 110, and forming a p-type impurity region over an entire surface of an uppermost drift region 110.

FIG. 4E is a view illustrating the step of forming a fifth layer of n-type and p-type impurity regions of the drift region 110, and forming the p-type impurity region over the entire surface of the uppermost drift region 110. In the present example, the formation of the n-type epitaxial layer and the selective implantation of the impurities are repeated five times. However, the repeat count may be five or less or five or more as long as it does not depart the spirit of the invention. Next, the n-type epitaxial layer which is the same as that of the drift region 110 is formed at the top. Next, the p-type impurities are implanted over an entire upper part of the n-type epitaxial layer. Thereby, the p-type base region 22 is formed in the subsequent heat treatment step.

The formation of the n-type epitaxial layer and the selective implantation of the impurities may be repeated once or more times and twenty times or less. In this case, the length from the top of the base region 22 to the bottom of the p-type column 32 may be 10 μm or more and 200 μm or less.

Figure 4F:
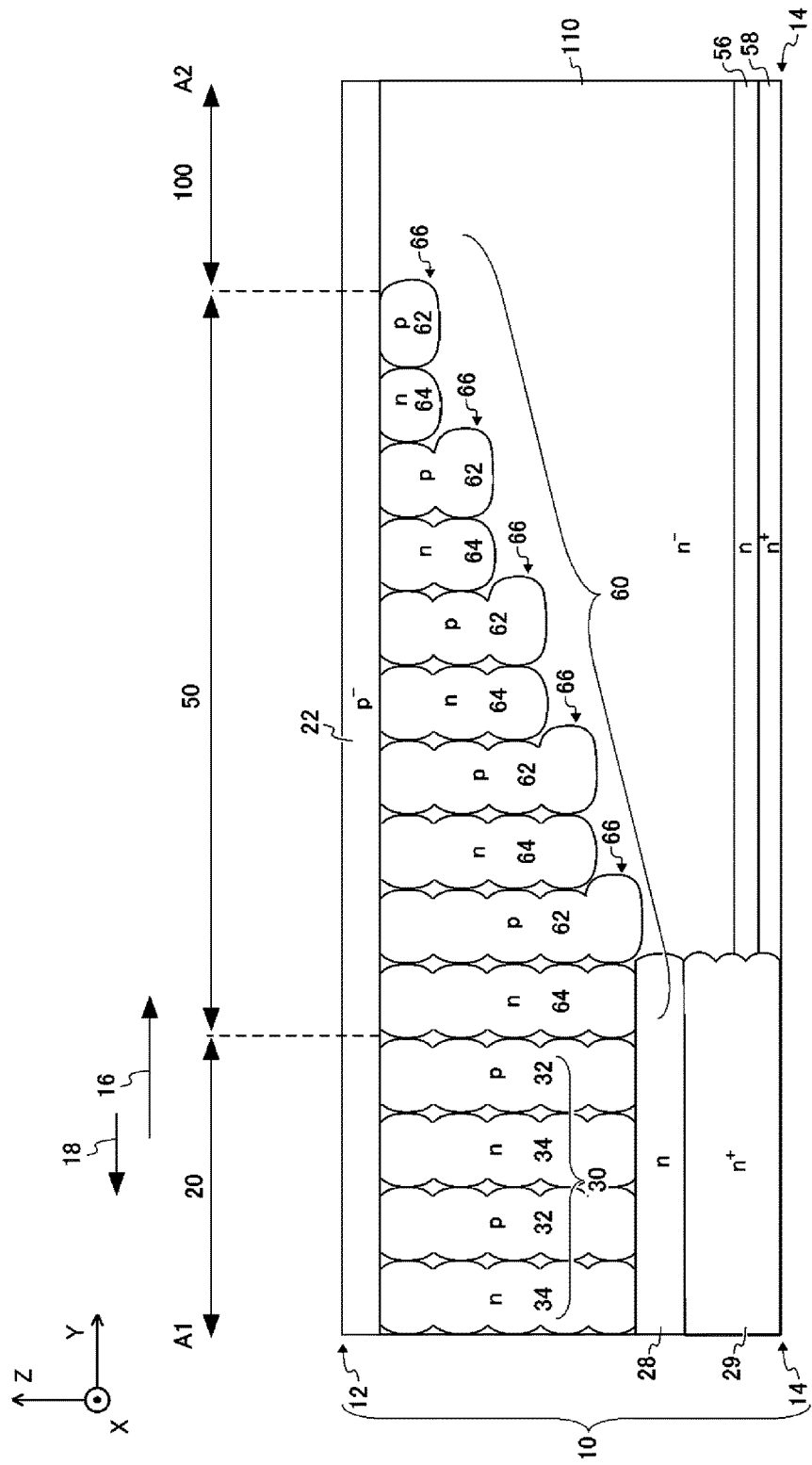
FIG. 4F is a view illustrating a step of forming a base region 22, a repetitive structure 30, and a repetitive structure 60 by heat diffusion.

FIG. 4F is a view illustrating the step of forming the base region 22, the repetitive structure 30, and the repetitive structure 60 by heat diffusion. In the present step, the semiconductor substrate 10 is thermally treated. At the top of the drift region 110, the p-type impurities uniformly diffuse downward, and the p-type base region 22 is formed. At the bottom of the drift region 110, the n-type impurities of the region 92 diffuse uniformly, and an n-type buffer region 28 and an $n^+$-type drain region 29 are formed. Also, in the drift region 110, n-type and p-type impurities are thermally diffused in a substantially radial fashion. Thereby, the impurity diffusion region is formed, the region having a shape made such that a plurality of spheres is stacked in the Z direction. In addition, the shape made such that a plurality of spheres is stacked in the Z direction merely schematically illustrates a region where the impurity concentration is particularly high.

In addition, the protruding region 66 is formed at the bottom of the p-type column 62.

Figure 4G:
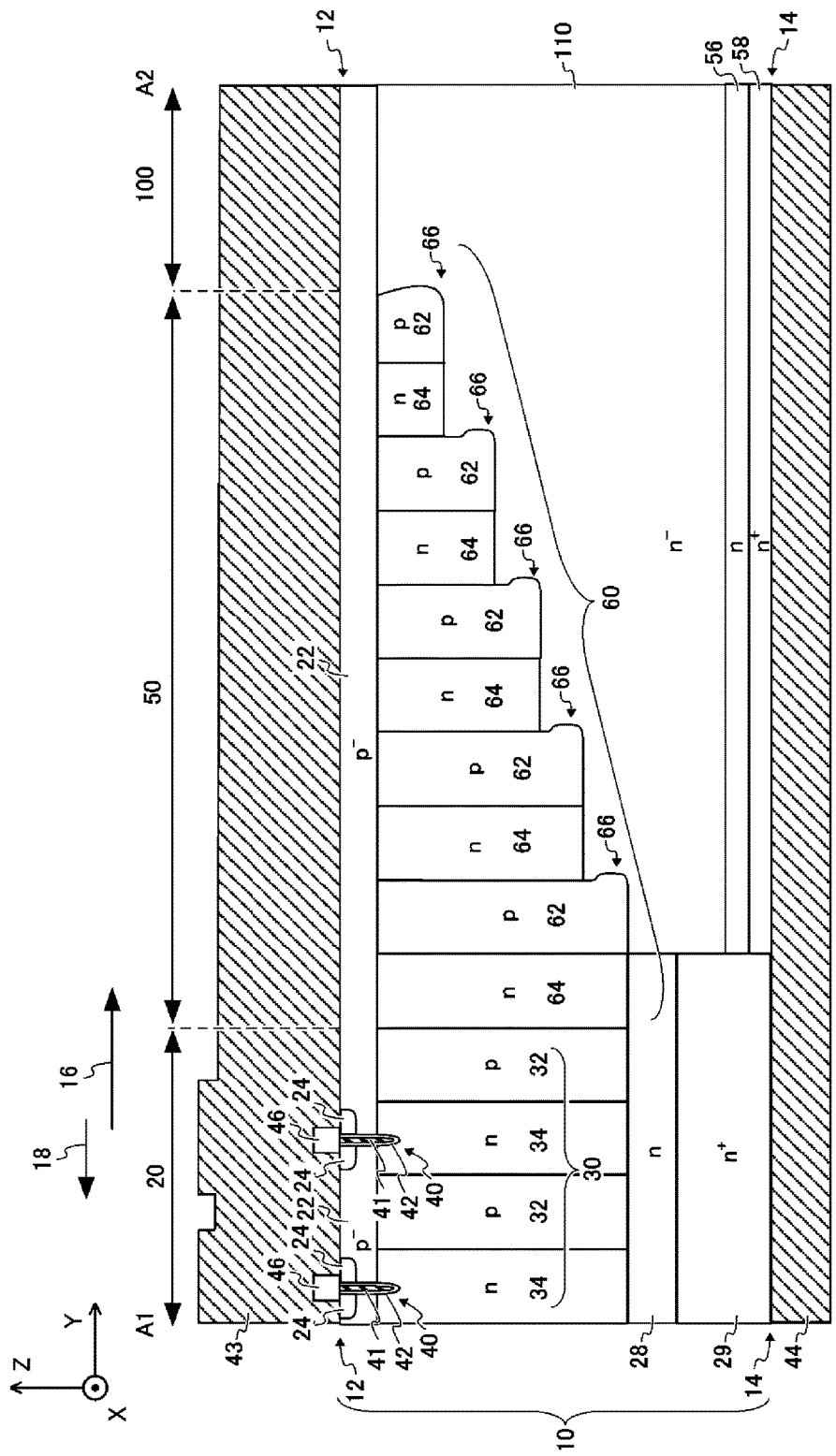
FIG. 4G is a view illustrating a complete state of an SJ MOSFET 20, a boundary portion 50, and an FWD 100.

FIG. 4G is a view illustrating the complete state of the SJ MOSFET 20, the boundary portion 50, and the FWD 100. The SJ MOSFET 20 may be adjacent to the IGBT 200, rather than the FWD 100. First, in the surface structure, a gate trench 40 is formed by patterning and etching, and the gate insulating film 41 and the gate electrode 42 are sequentially formed. Next, the n-type source region 24 is formed by patterning and implanting the n-type impurities, and then, a contact pattern is formed in an interlayer insulating film 46. Next, the source electrode 43 is formed by metal sputtering. Regarding a rear surface structure, the support substrate 90 is removed by etching, and n-type impurities forming the FS layer 56 and the n-type layer 58 and p-type impurities forming the collector layer 59 are implanted from the rear surface (the side of the other main surface 14). Subsequently, activation by heat treatment is performed, and the FS layer 56, the n-type layer 58 and the collector layer 59 are formed. Furthermore, subsequently, the drain electrode 44 is formed by metal sputtering. In addition, regarding the collector layer 59, refer to the example of FIG. 14.

In the FWD 100 and the SJ MOSFET 20, n-type impurities forming the FS layer 56 and the n-type layer 58 are implanted from the rear surface. After implanting, into the IGBT 200, p-type impurities forming the FS layer 56 by rear surface patterning technique, Se (selenium), H+(proton), or P (phosphorous) may be implanted, as the n-type impurities forming the collector layer, to form the FS layer 56.

Also, as another manufacturing method, after removing a support substrate 90 by etching, and implanting n-type impurities forming the FS layer 56 and p-type impurities forming the collector layer 59 of the IGBT 200 over the entire surface from the rear surface, the n-type impurities forming the n-type layer 58 may be implanted into a region other than that forming the collector layer 59 of the IGBT 200 by rear surface patterning technique.

Further, as another manufacturing method, after removing the support substrate 90 by etching, and implanting n-type impurities forming the FS layer 56 and the n-type impurities forming the n-type layer 58 over the entire surface from rear surface, p-type impurities forming the collector layer 59 of the IGBT 200 may be implanted into only a region forming the collector layer 59 of the IGBT 200 by rear surface patterning technique. In addition, although no detailed description is given in the present example, the n-type layer 58 may be made by polishing and thinning the rear surface of the semiconductor substrate with the use of the n-type semiconductor substrate, rather than the support substrate 90.

Figure 5A:
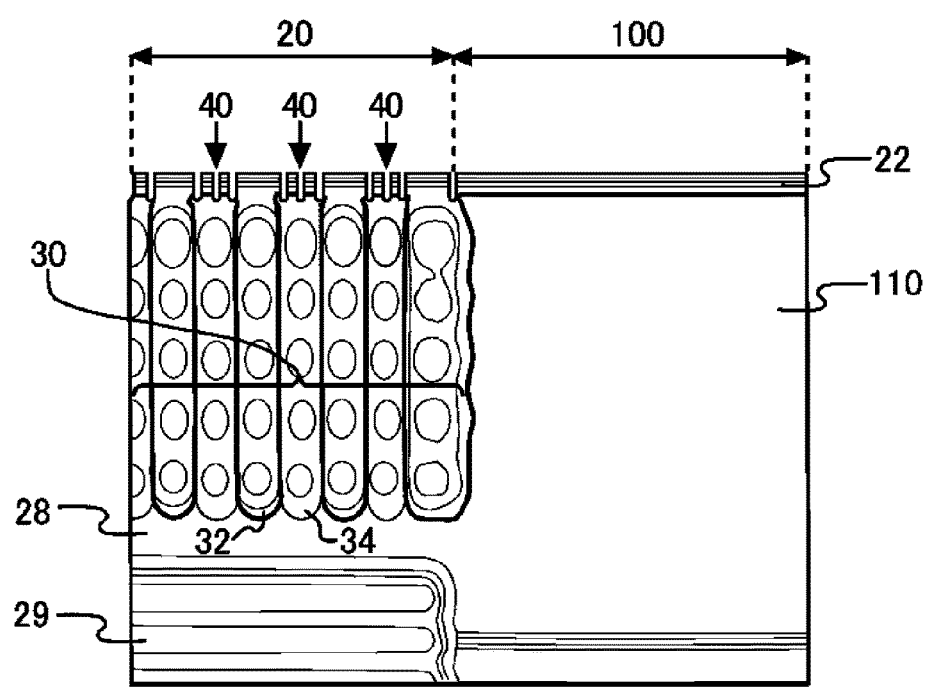
FIG. 5A is a view illustrating a case where the boundary portion 50 is not present.
Figure 5B:
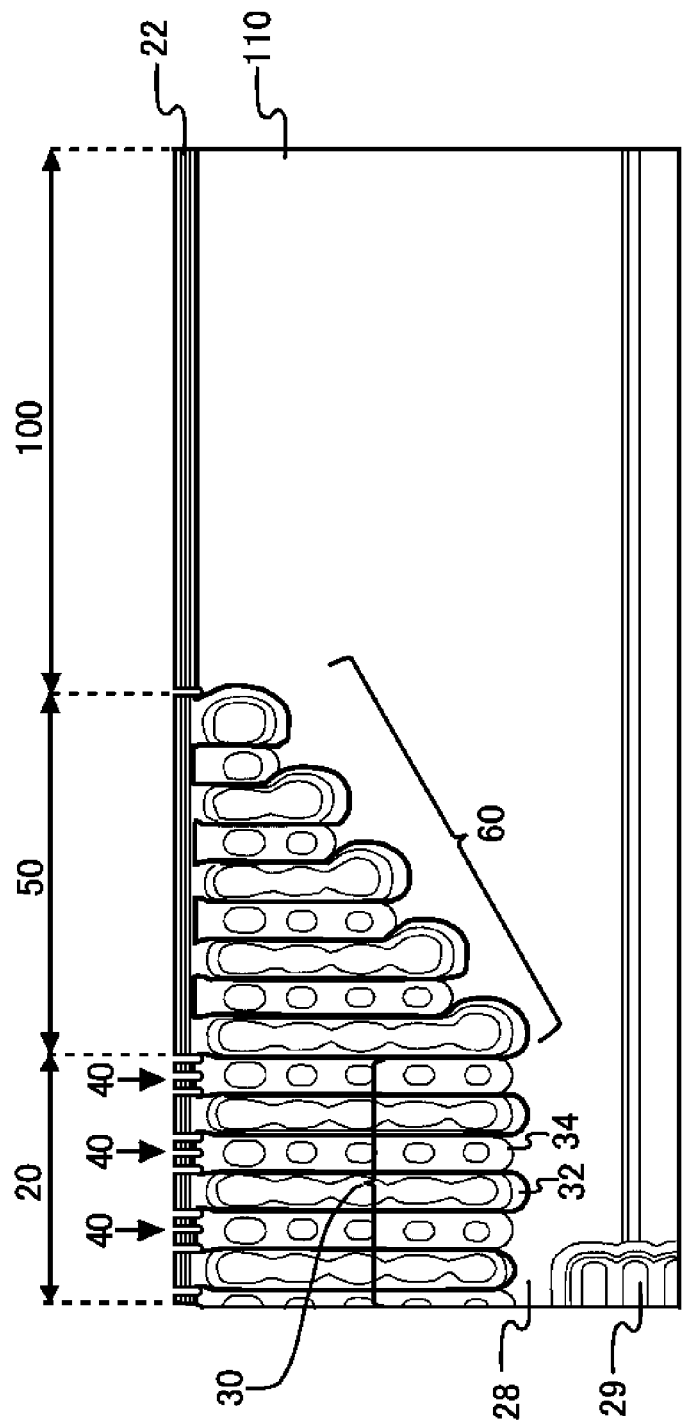
FIG. 5B is a view illustrating a case where the boundary portion 50 is present.
Figure 6A:
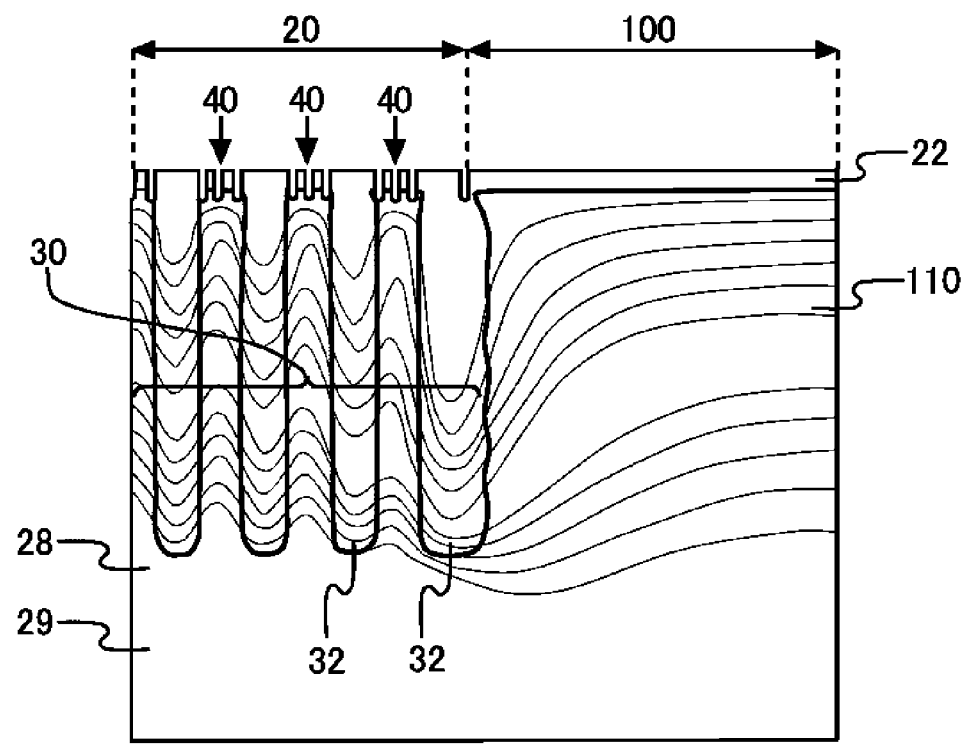
FIG. 6A is a view illustrating potential distribution for a case where the boundary portion 50 is not present.
Figure 7A:
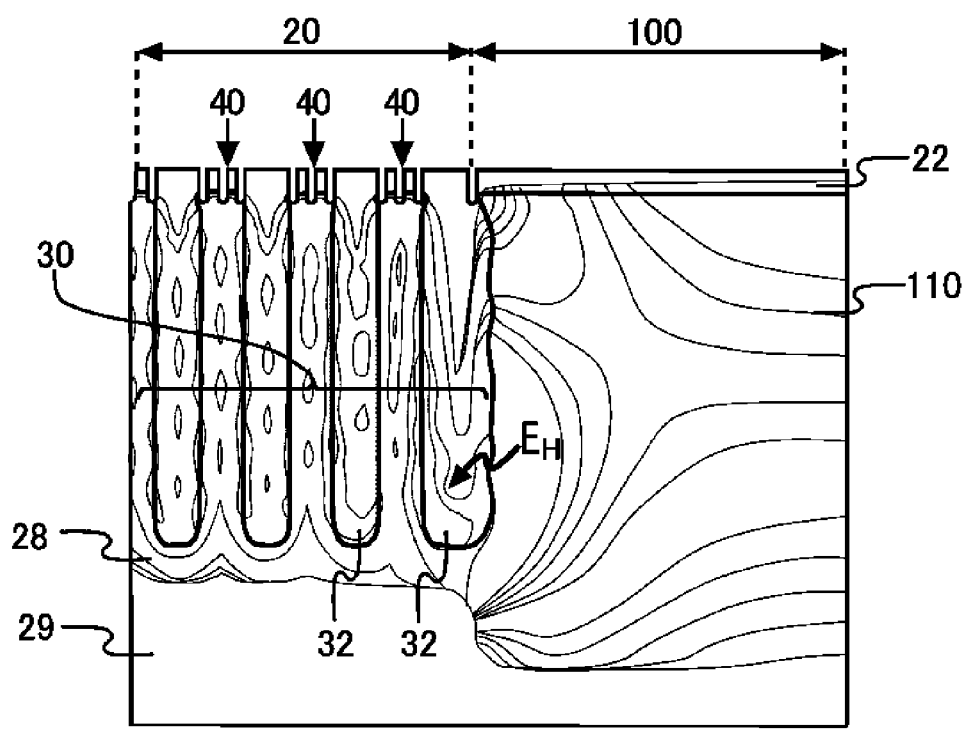
FIG. 7A is a view illustrating electric field distribution for a case where the boundary portion 50 is not present.

FIG. 5A is a view illustrating a case where the boundary portion 50 is not present. FIG. 5B is a view illustrating a case where the boundary portion 50 is present. In the constitution illustrated in FIG. 5A, simulation in FIG. 6A and FIG. 7A which will be described later was performed. In FIG. 5A, FIG. 6A, and FIG. 7A, the SJ MOSFET 20 and the FWD 100 are directly adjacent to each other.

Figure 6B:
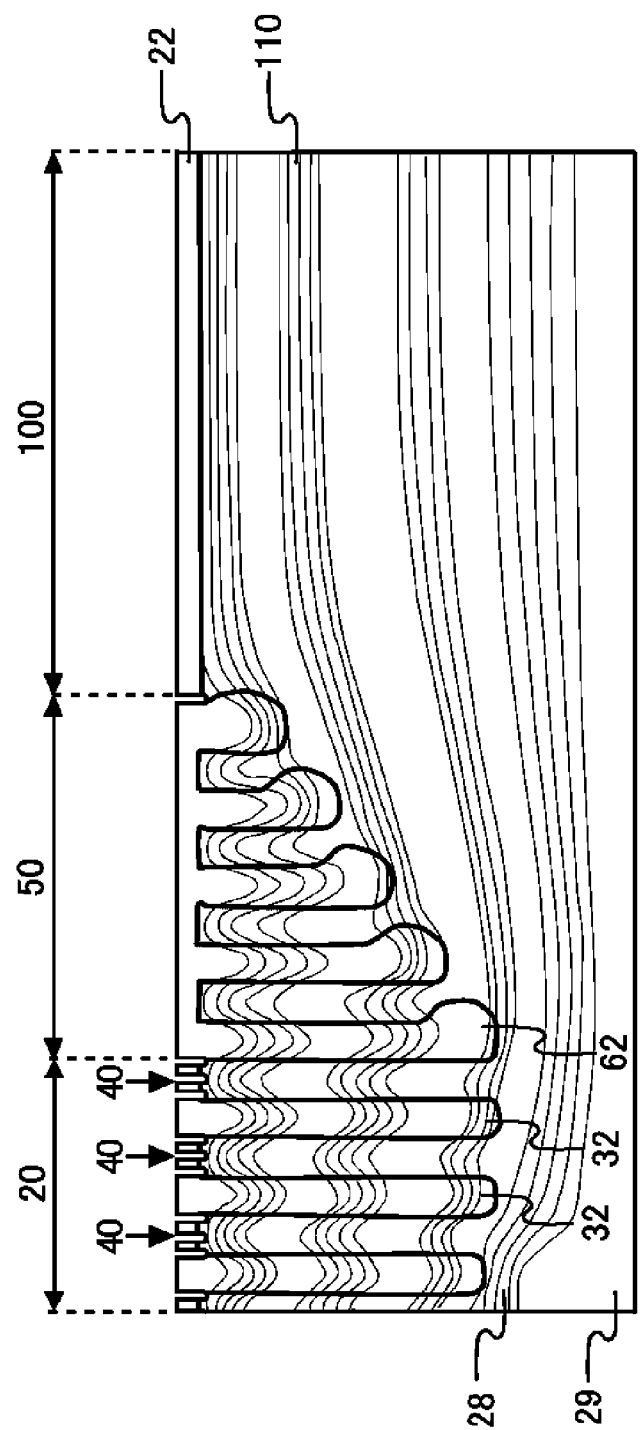
FIG. 6B is a view illustrating potential distribution for a case where the boundary portion 50 is present.
Figure 7B:
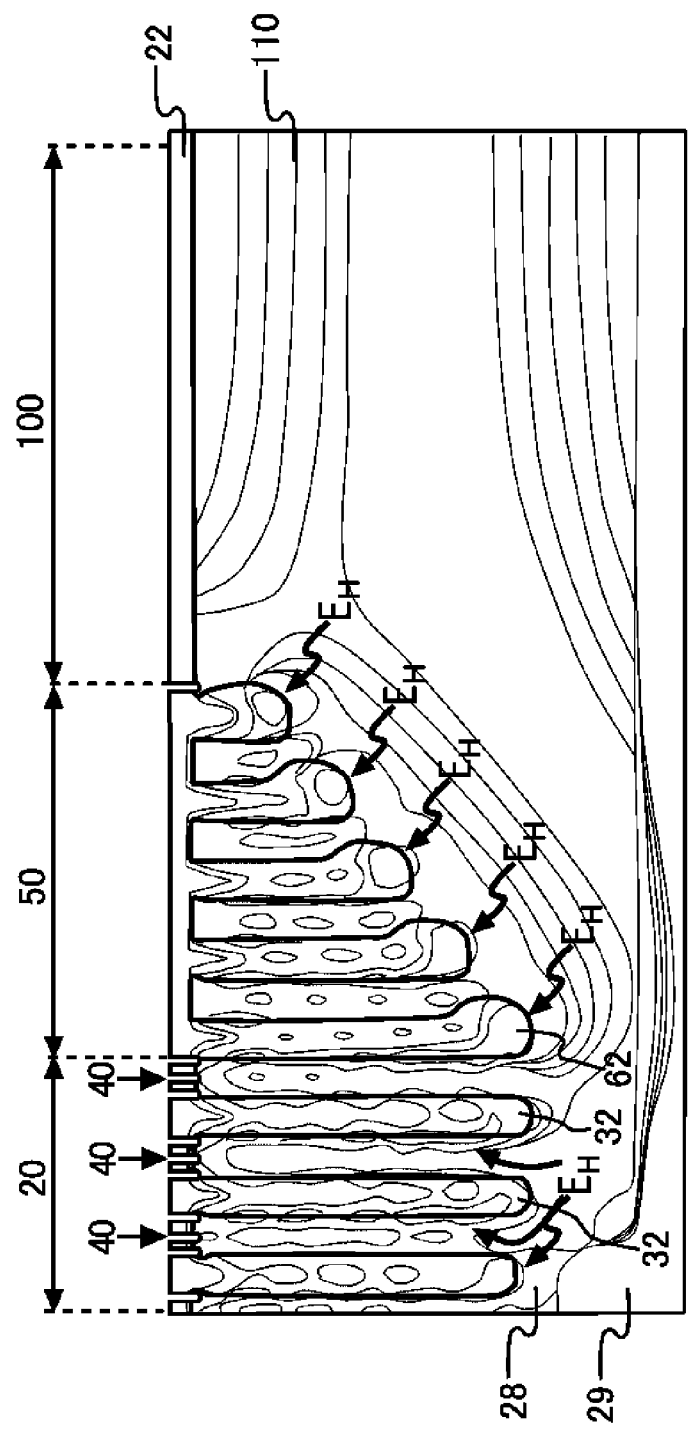
FIG. 7B is a view illustrating electric field distribution for a case where the boundary portion 50 is present.

Meanwhile, in the constitution illustrated in FIG. 5B, simulation in FIG. 6B and FIG. 7B which will be described later was performed. In FIG. 5B, FIG. 6B, and FIG. 7B, the boundary portion 50 was provided between the SJ MOSFET 20 and the FWD 100 as was described in FIG. 3 and FIG. 4A to FIG. 4F. In addition, although FIG. 5A and FIG. 5B are different with respect to display scaling, the size of each structure in the SJ MOSFET 20 is the same in FIG. 5A and FIG. 5B. In addition, a first isolation trench which will be described later is provided at adjacent gate trenches 40 over the p-type column 32.

FIG. 6A is a view illustrating potential distribution for a case where the boundary portion 50 is not present. FIG. 6B is a view illustrating potential distribution for a case where the boundary portion 50 is present. In FIG. 6A, a change in equipotential lines from the p-type column 32, which is the closest to the FWD 100, toward the FWD 100 is steep. Therefore, at the bottom of the p-type column 32 which is the closest to the FWD 100, an interval between the equipotential lines is narrow, particularly on the left side of the bottom. Contrary to the above, in FIG. 6B, a change in the equipotential lines is gentle compared to FIG. 6A by arranging the depth of the p-type column 32 of the boundary portion 50 gradually shallower toward the side of the FWD 100. Also, in FIG. 6B, no steep change in the equipotential lines is seen at the bottom of the p-type column 32 of the outermost side of the outer direction 16 of the SJ MOSFET 20.

FIG. 7A is a view illustrating electric field distribution for a case where the boundary portion 50 is not present. FIG. 7B is a view illustrating electric field distribution for a case where the boundary portion 50 is present. In FIG. 7A, at the bottom of the p-type column 32 which is the closest to the FWD 100 (particularly, on the left side of the bottom), the change in the equipotential line of FIG. 6A is steep, and thus the electric field extremely concentrates therein. A location of this electric field concentration is illustrated by $E_H$. In addition, in other p-type columns 32, there is no location where the electric field concentrates to the same degree as the bottom of the p-type column 32 which is the closest to the FWD 100.

Contrary to the above, in FIG. 7B, the locations of the electric field concentration $E_H$ are present at the bottom of each p-type column 62 of the boundary portion 50. However, the intensity of $E_H$ of FIG. 7B is the same as or weaker than the intensity of $E_H$ of FIG. 7A. Also, since the p-type columns 62 become gradually deeper in the inner direction 18, the electric field can be shared among each of the p-type column 62, and the depletion layer is likely to spread from the FWD 100 to the SJ MOSFET 20. For this reason, the avalanche current can be suppressed, and the breakdown voltage can be further increased in FIG. 7B than that in FIG. 7A. In addition, an upper limit of breakdown voltage of 150° C. is set to 450V in FIG. 6A and FIG. 7A, whereas an upper limit of breakdown voltage could be set to 850V in FIG. 6B and FIG. 7B.

Figure 8A:
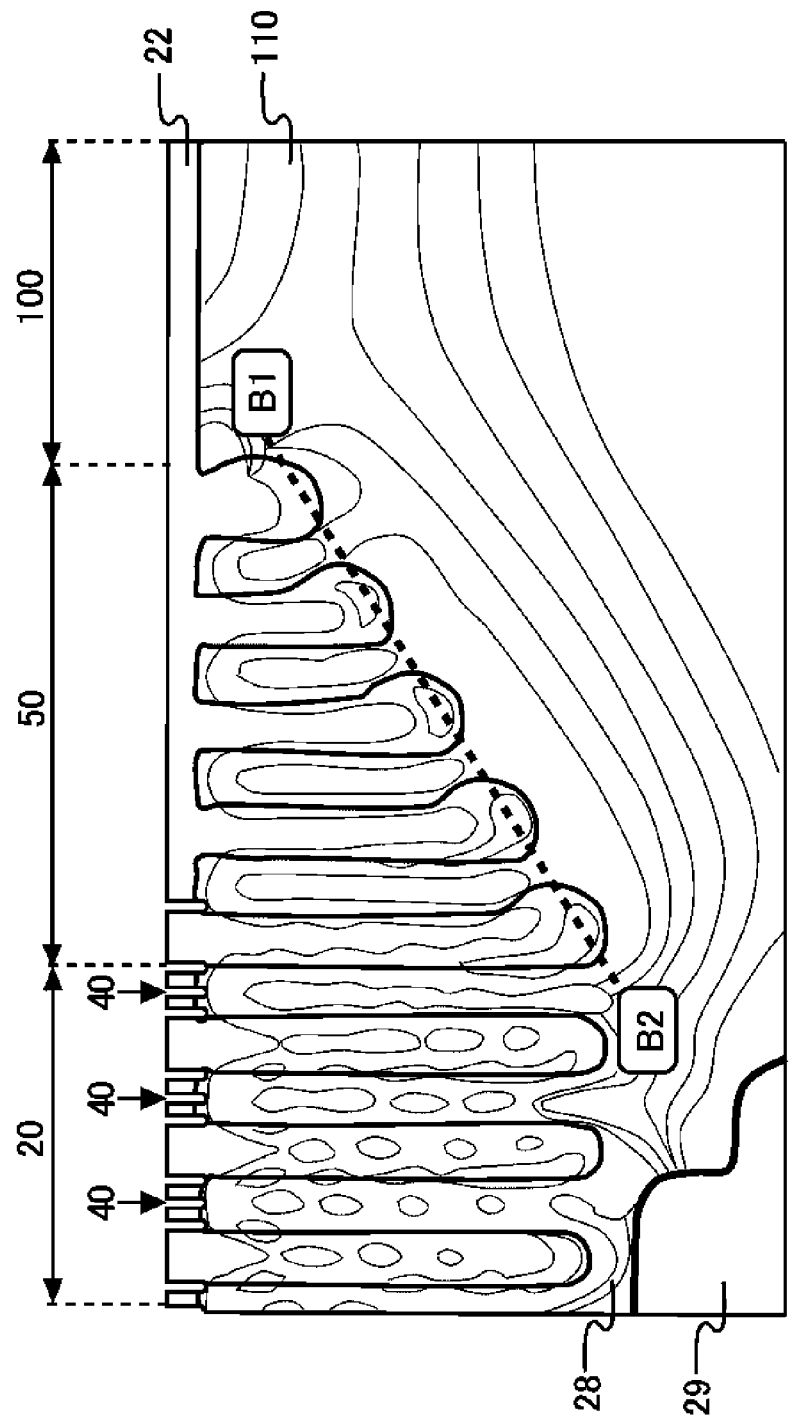
FIG. 8A is a view illustrating electric field distribution for a case where the boundary portion 50 is present.
Figure 8B:
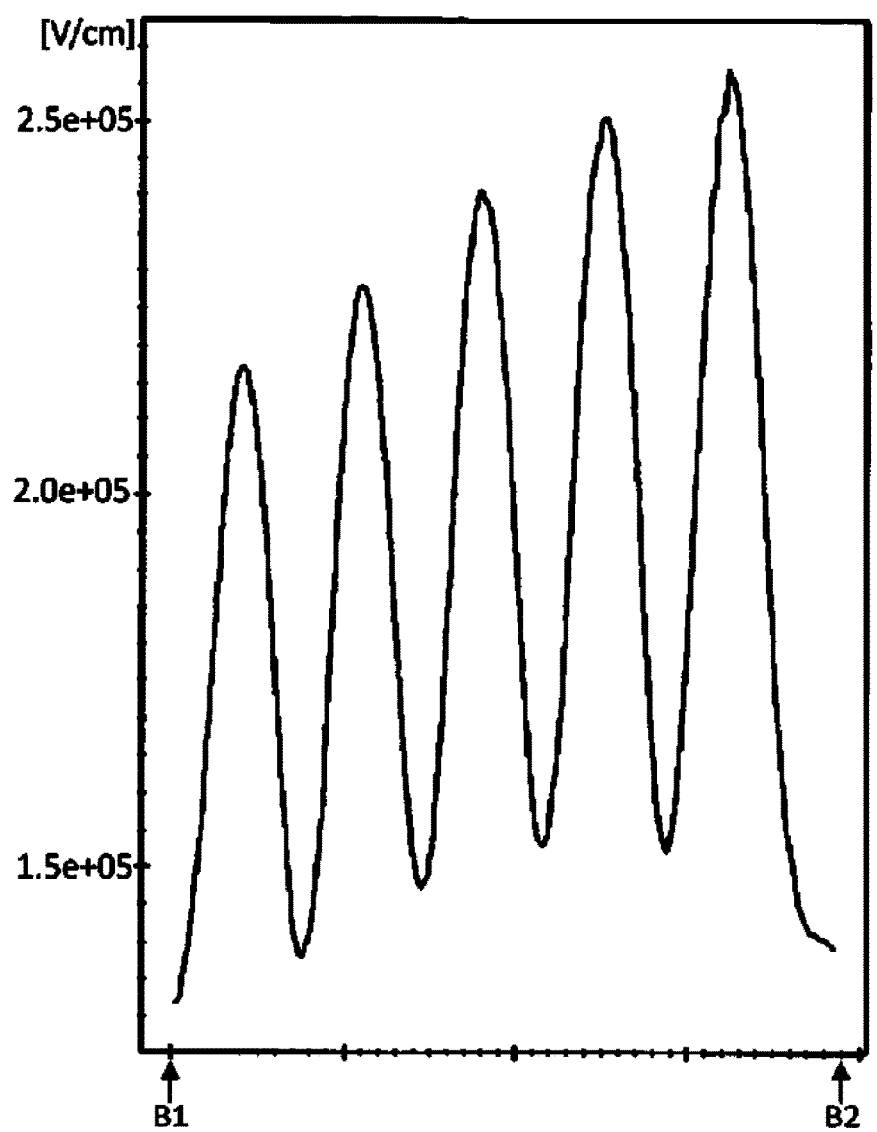
FIG. 8B is a view illustrating electric field intensity along B1-B2 for a case where the boundary portion 50 is present.

FIG. 8A is a view illustrating electric field distribution for a case where the boundary portion 50 is present. FIG. 8B is a view illustrating electric field intensity along B1-B2 for a case where the boundary portion 50 is present. As illustrated in FIG. 8A, the electric field intensity [V/cm] along B1-B2 line passing through the bottom of the p-type column 62 which becomes gradually deeper in the boundary portion 50 can now share the electric field intensity among each of the p-type columns 62 at an approximately constant ratio at the bottom of each p-type column 62, as illustrated in FIG. 8B.

Figure 9:
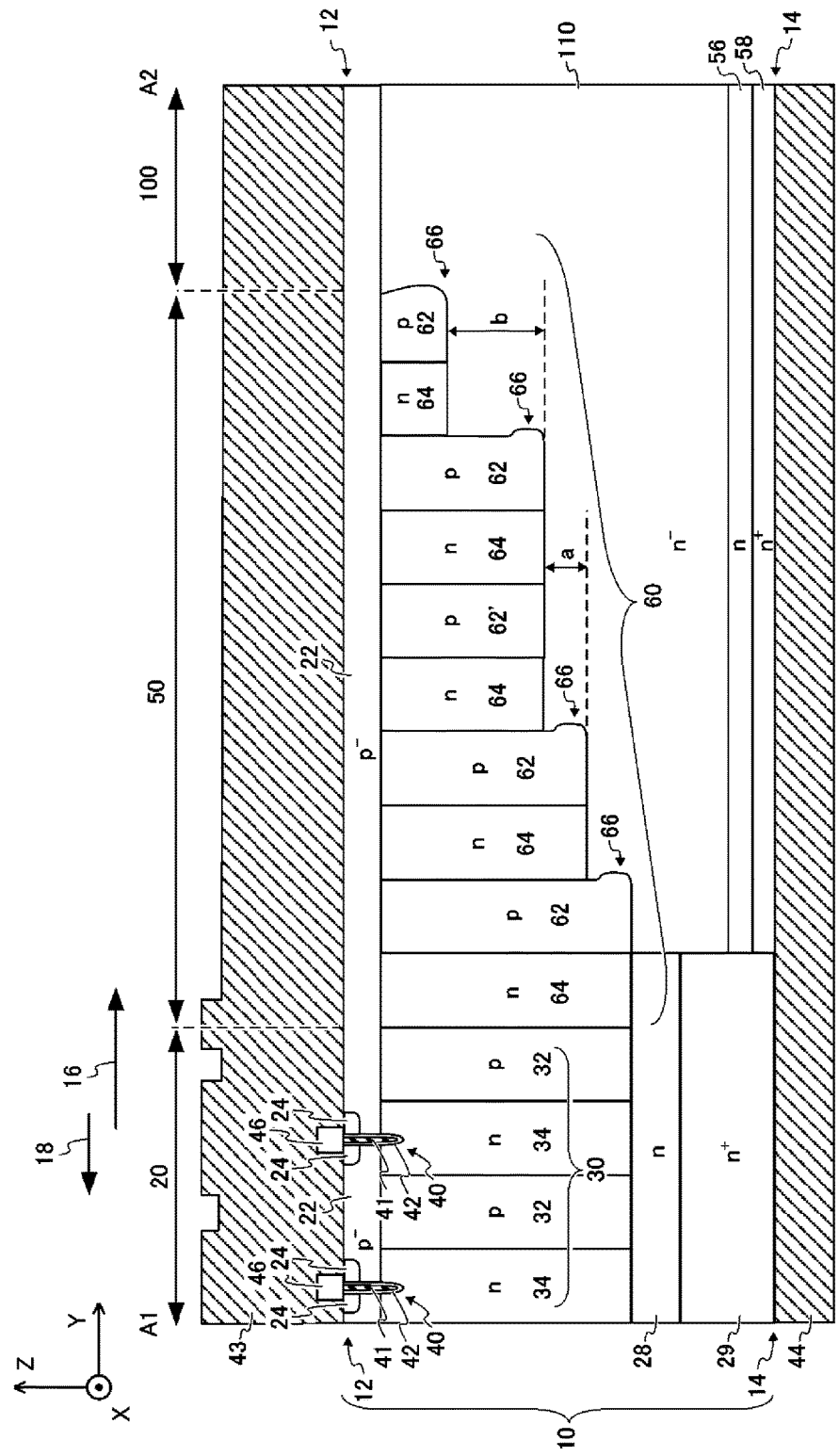
FIG. 9 is a schematic view illustrating a cross-section along A1-A2 in a second embodiment.

FIG. 9 is a schematic view illustrating the cross-section along A1-A2 in a second embodiment. The repetitive structure 60 of the present example has p-type column 62' having the same depth as the n-type column 64 adjacent to the outer direction 16, and not having the protruding region 66 at the bottom. The second embodiment is different from the first embodiment on this point. Also, a difference b in the height between the bottom of the p-type column 62' not having the protruding region 66 and the bottom of the p-type column 62 and the n-type column 64 proximate to the p-type column 62' in the outer direction 16 is two-fold or more greater than a difference a in the height between the bottom of the p-type column 62' not having the protruding region 66 and the bottom of the p-type column 62 and the n-type column 64 proximate to the p-type column 62' in the inner direction 18. Thereby, the electric field concentrates on the p-type column 62 where the protruding region 66 arranged in the boundary portion 50 generating the difference b in the height, and thus, it is possible to prevent the electric field from being concentrated on the SJ MOSFET 20. In addition, there is only one p-type column 62' not having the protruding region 66.

Figure 10:
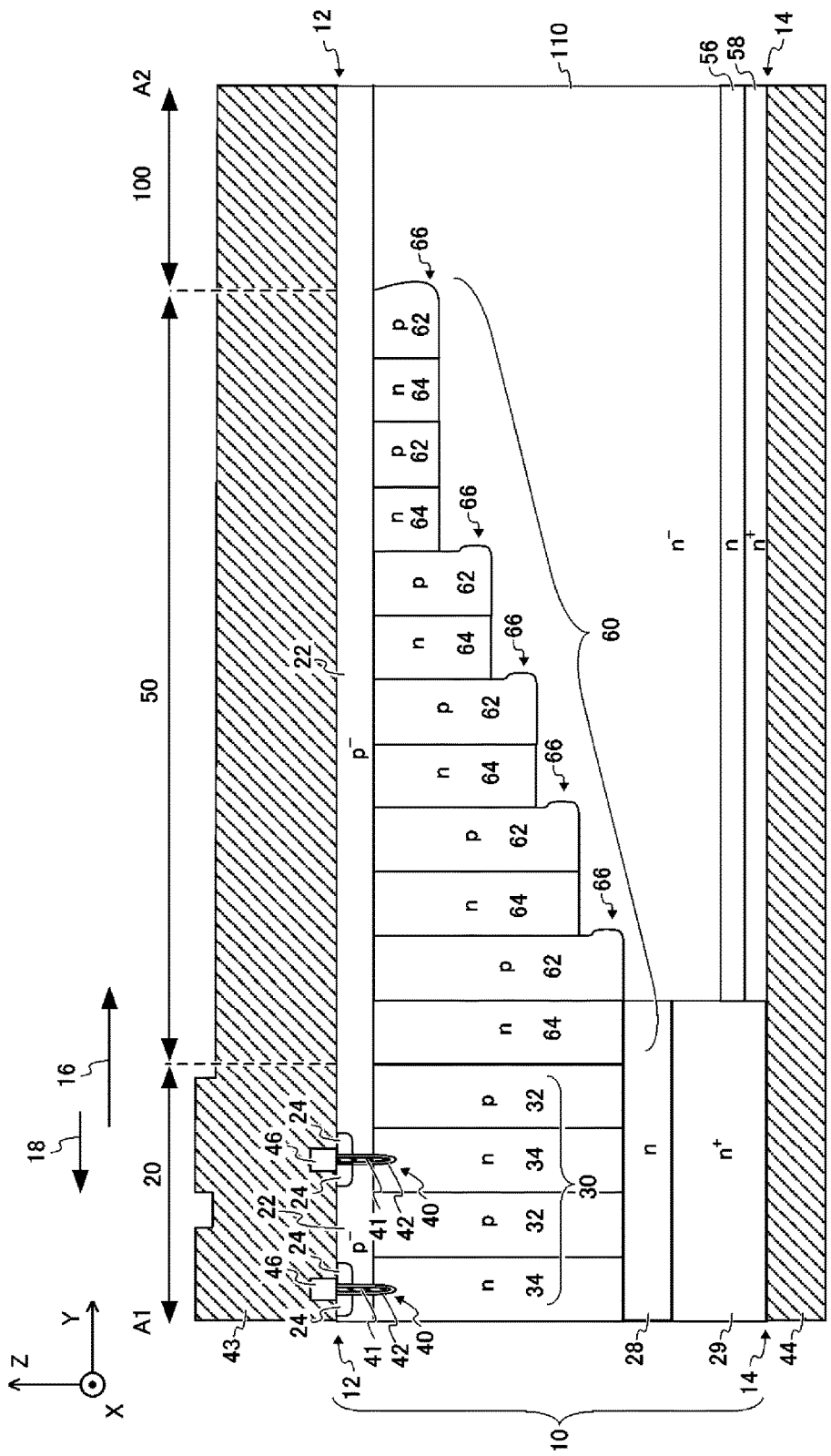
FIG. 10 is a schematic view illustrating a cross-section alone A1-A2 in a third embodiment.

FIG. 10 is a schematic view illustrating the cross-section along A1-A2 in a third embodiment. At the end portion of the outer direction 16, the boundary portion 50 of the present example has two sets of p-type column 62 and the n-type column 64 having the same depth consecutively in the outer direction 16. The third embodiment is different from the first embodiment on this point. In the present example, compared to the first embodiment, the depletion layer is more likely to spread at the bottom of the repetitive structure 60. Therefore, in the present example, the breakdown voltage can be improved compared to the first embodiment. In addition, the constitution of the present example may be combined with that of the second embodiment.

In addition, in a case where the widths of each p-type column 62 and n-type column 64 in the outer direction 16 are the same as those of the first embodiment, the area occupied by the boundary portion 50 in the one main surface 12 will be larger than that of the first embodiment. In addition, the area occupied by the boundary portion 50 may be set to the same as that of the first embodiment by narrowing the widths of each p-type column 62 and n-type column 64.

Figure 11:
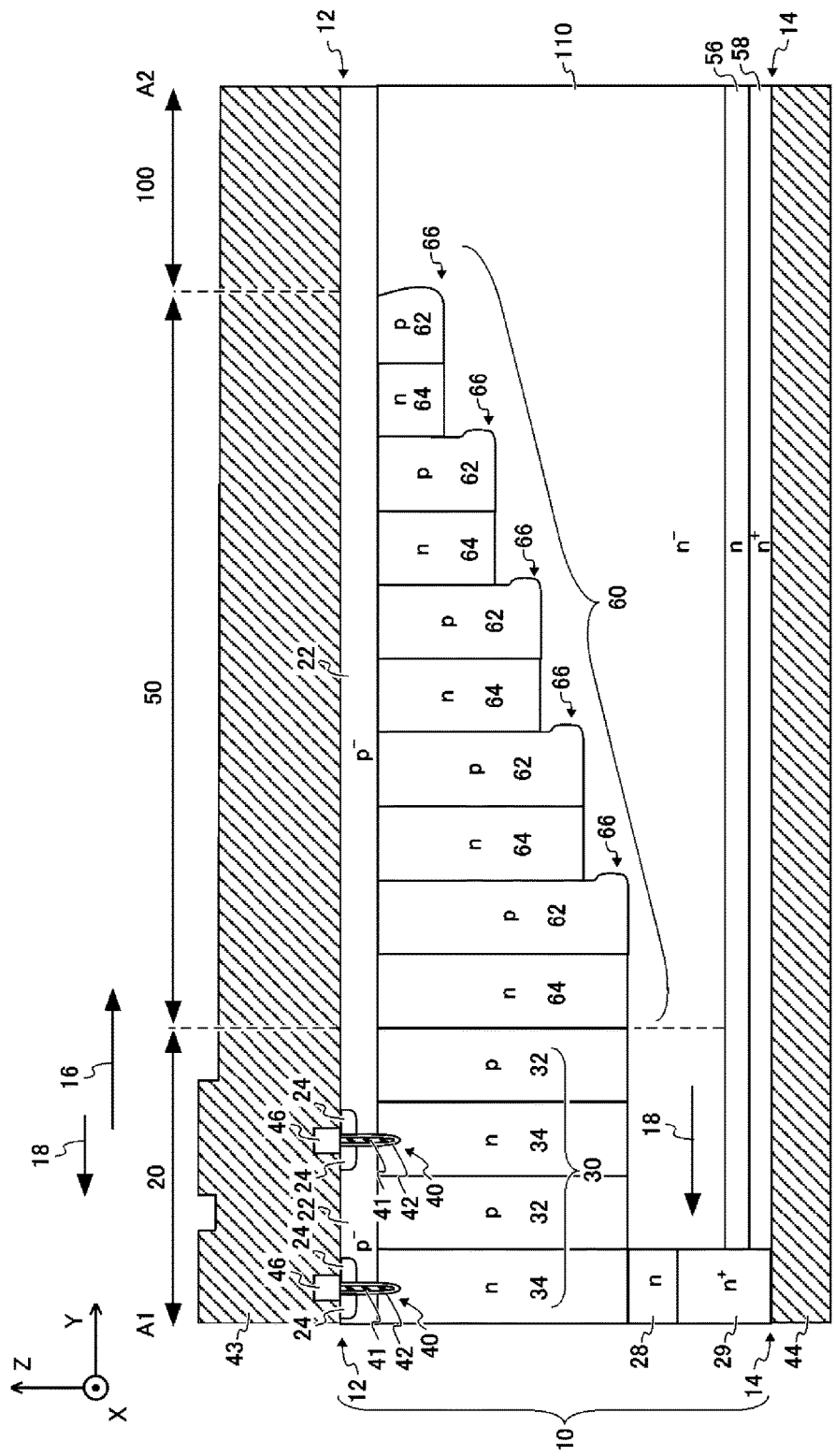
FIG. 11 is a schematic view illustrating a cross-section along A1-A2 in a fourth embodiment.

FIG. 11 is a schematic view illustrating the cross-section along A1-A2 in a fourth embodiment. In the present example, the buffer region 28 and the drain region 29 is retracted toward the inner direction 18. That is, the end portion in the buffer region 28 and the drain region 29 of the present example at the side of the boundary portion 50 is located away from the p-type column 32 and the n-type column 34 which are the closest to the boundary portion 50, the p-type column 32 and the n-type column 34 being provided in the SJ MOSFET 20. The fourth embodiment is different from the first embodiment on this point.

In the present example, the drift region 110 extends into the bottom of the SJ MOSFET 20 at the side of the boundary portion 50. In the drift region 110, the impurity concentration is low than that of the p-type column 32 and n-type column 34 of the repetitive structure 30, and thus, the depletion layer is likely to spread. For that reason, in the present example, the depletion layer can spread even further toward the inner direction 18 compared to the first embodiment. As a result, the breakdown voltages improves compared to that of the first embodiment. In addition, the constitution of the present example may be combined with that of the second and third embodiments.

Figure 12:
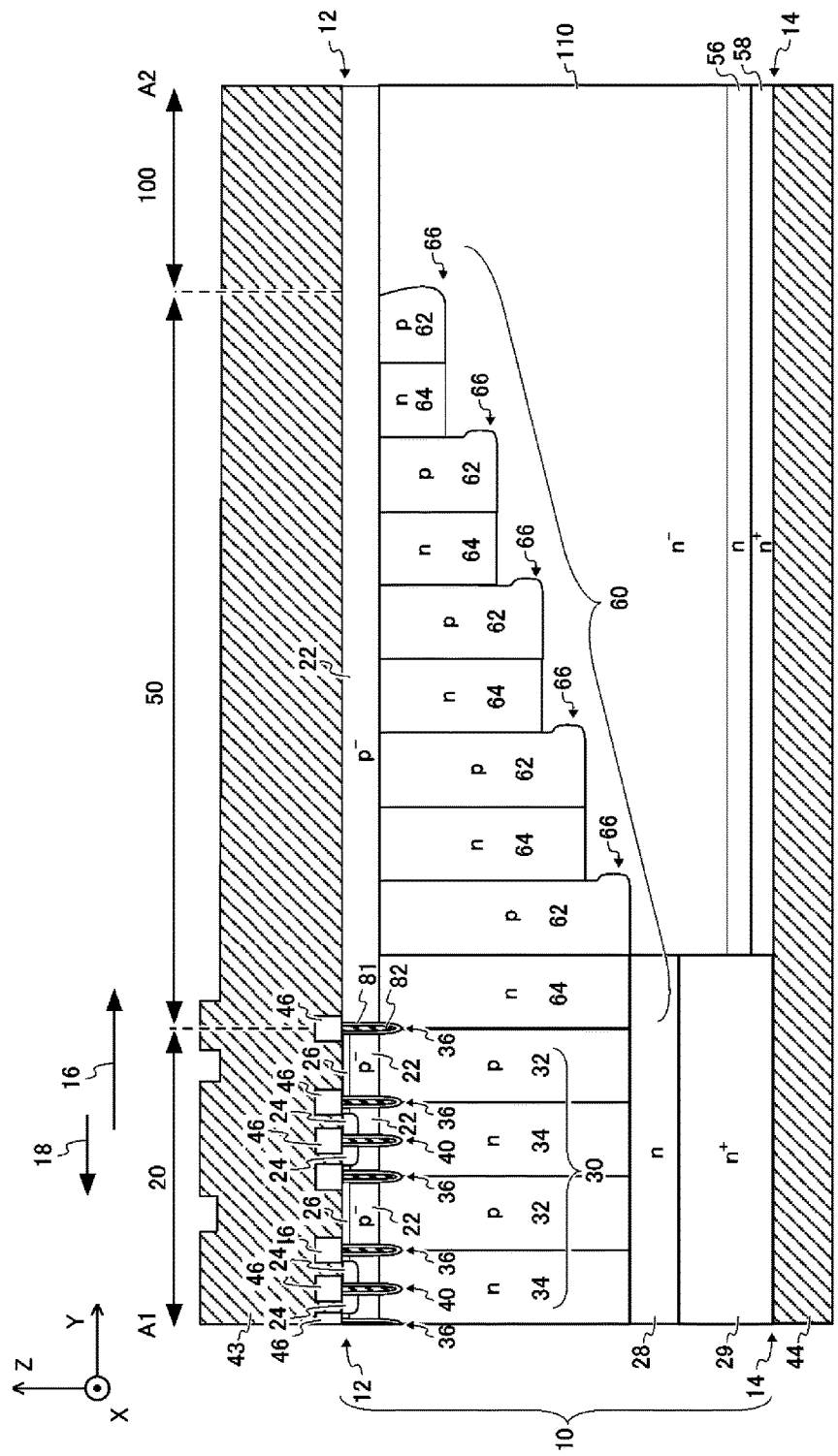
FIG. 12 is a schematic view illustrating a cross-section along A1-A2 in a fifth embodiment.

FIG. 12 is a schematic view illustrating the cross-section along A1-A2 in a fifth embodiment. The SJ MOSFET of the present example further includes the surface region 26 and the first isolation trench 36. The fifth embodiment is different from the first embodiment on this point.

The surface region 26 is provided in a region on an outermost surface of the base region 22, and not overlapping the source region 24. The surface region 26 of the present example is provided between the source region 24 and the first isolation trench 36 and between two first isolation trenches 36. The surface region 26 has n-type impurity concentration lower than that of the source region 24. The surface region 26 is electrically connected to the source electrode 43 provided on the base region 22.

The base region 22 and the surface region 26 constitute a surface region diode. The base region 22 and the n-type column 34 constitute a first body diode. Also, the p-type column 32 and the buffer region 28 constitute a second body diode. The surface region diode and the first body diode are serially connected in a mutually reverse direction. Similarly, the surface region diode and the second body diode are also serially connected in a mutually reverse direction. Hereinafter, the surface region diode and the first and second body diodes are referred to as an integrated body diode.

At the time of reverse bias (when the circuit block $C_{xy}$ is turned OFF), the source electrode 43 becomes higher potential than the drain electrode 44. In the present example, at the time of reverse bias (at the time of turning off), the electric current does not flow through the drain electrode 44 from the source electrode 43 of the SJ MOSFET 20. In the present example, although the electric current at the time of reverse bias flows through the FWD 100, the flow of the electric current is extremely reduced in the SJ MOSFET 20. The reason for the above is that potential difference occurs between the base region 22 and the surface region 26, and Vf (forward direction voltage) increases. The flow of the electric current is extremely reduced as long as no voltage exceeding the potential difference which corresponds to Vf of the SJ MOSFET 20 is applied to the integrated body diode.

Assuming a case where the surface region 26 has the same n-type impurity concentration as the source region 24 and has the same depth as the source region 24, it is difficult to take the potential of the base region 22 and the p-type column 32, and the depletion layer is difficult to spread. Therefore, the n-type impurity concentration of the surface region 26 is taken to be greater than the p-type impurity concentration of the base region 22, and the depth of the surface region 26 is set to be shallower than the depth of the source region 24. Thereby, it is easier for the depletion layer to spread in the base region 22 and the p-type column 32. Thereby, the integrated body diode can maintain the breakdown voltage at the time of reverse bias.

The surface region 26 of the present example has a concentration of n-type impurities lower than that of the source region 24. The n-type impurity concentration of the source region 24 may be $E+17$ $cm^{-3}$ or more and $E+21$ $cm^{-3}$ or less. Contrary to the above, the impurity concentration of the surface region 26 may be determined according to the breakdown voltage. The impurity concentration of the surface region 26 may be one time or more greater than the base region 22, and it is desirable that the impurity concentration of the surface region 26 is one time or more and two times or less approximately greater, in a case, for example, where the breakdown voltage is 600V.

In the present example, Vf of the integrated body diode of the SJ MOSFET 20 can be set higher than Vf of the FWD 100 connected in parallel, by providing the surface region 26. For that reason, compared to a case where the surface region 26 is not present, it is possible to flow more electric current at the time of turning off, through the FWD 100 rather than SJ MOSFET 20.

The first isolation trench 36 extends downward from a portion of the surface region 26 until it reaches the boundary between the p-type column 32 and the n-type column 34. The first isolation trench 36 has an insulating film 81 and an electrode 82, similar to the gate trench 40. The insulating film 81 is a thin film of insulation formed in contact with the side wall and bottom of the first isolation trench 36. The electrode 82 is formed in contact with the insulating film 81. The electrode 82 of the present example is formed of conductive materials such as polysilicon. Although the electrode 82 of the present example is electrically isolated from the source electrode 43 by the interlayer insulating film 46, it is electrically connected to the gate electrode 42.

In addition, instead of electrically connecting the electrode 82 and the gate electrode 42, the electrode 82 may be electrically connected to the source electrode 43 without providing the interlayer insulating film 46 on the first isolation trench 36. Thereby, the capacity of the floating region can be reduced, and an effect of improving switching characteristics of source-gate voltage ($V_{GS}$) and source-drain voltage ($V_{DS}$) is exhibited. In addition, the floating region refers to a region transversely sandwiched by the gate trench 40 and the first isolation trench 36 and vertically sandwiched by the source region 24 and the surface region 26 and the n-type column 34. In addition, the constitution of the present example may be combined with those of the second to fourth embodiments.

Figure 13:
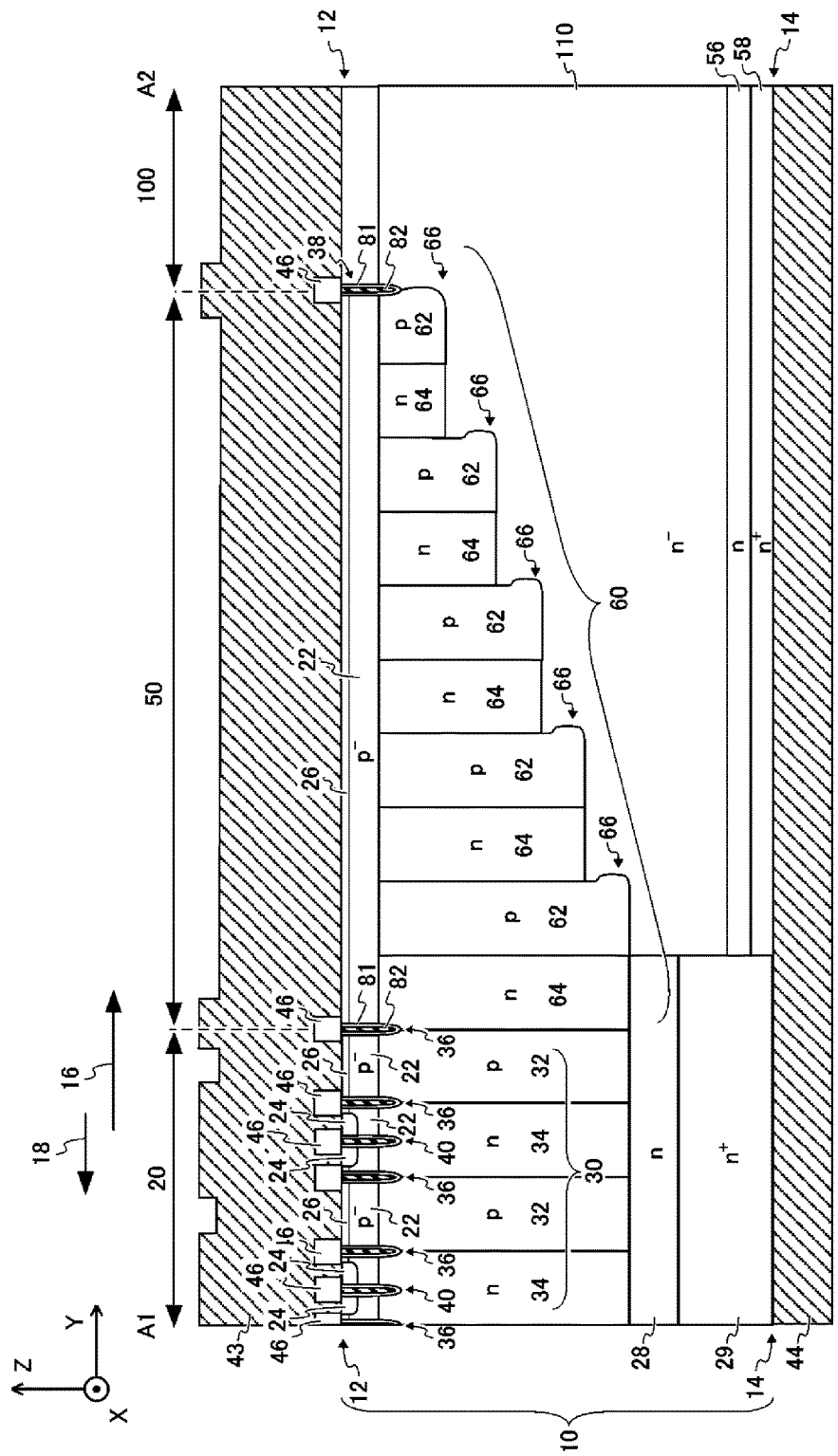
FIG. 13 is a schematic view illustrating a cross-section along A1-A2 in a sixth embodiment.

FIG. 13 is a schematic view illustrating the cross-section along A1-A2 in a sixth embodiment. The boundary portion 50 of the present example includes the surface region 26 and the second isolation trench 38. The sixth embodiment is different from the fifth embodiment on this point. The surface region 26 is provided extending from the SJ MOSFET 20. That is, the surface region 26 has the same constitution in the SJ MOSFET 20 and the boundary portion 50.

The second isolation trench 38 is provided extending downward from a portion of the surface region 26 until it reaches any of the p-type column 62, the n-type column 64, and the boundary of the p-type column 62 and the n-type column 64 adjacent to each other. The second isolation trench 38 of the present example is provided reaching one side portion of the p-type column 62 which is the closest to the outer direction 16, the one side portion of the p-type column 62 being provided in the boundary portion 50.

In the present example, the base region 22 and the surface region 26 of the boundary portion 50 constitute a surface region diode. The base region 22 and the surface region 26 of the boundary portion 50 are integrally constituted with the SJ MOSFET 20. An area of the surface region diode combining SJ MOSFET 20 and the boundary portion 50 becomes greater than an area of the surface region diode of the SJ MOSFET 20 only by providing the boundary portion 50 with the surface region diode as well. For that reason, the surface region diode of the boundary portion 50 increases Vf of the integrated body diode of the SJ MOSFET 20. Therefore, Vf of the SJ MOSFET 20 and the boundary portion 50 can be increased than Vf of the sole SJ MOSFET 20.

The second isolation trench 38 has the insulating film 81 and the electrode 82, similar to the first isolation trench 36. The electrode 82 of the present example is electrically isolated from the source electrode 43 by the interlayer insulating film 46, and is electrically connected to the gate electrode 42. However, similar to the first isolation trench 36, the electrode 82 of the second isolation trench 38 may be electrically connected to the source electrode 43. In addition, the constitution of the present example may be combined with those of the second to fourth embodiments.

Figure 14:
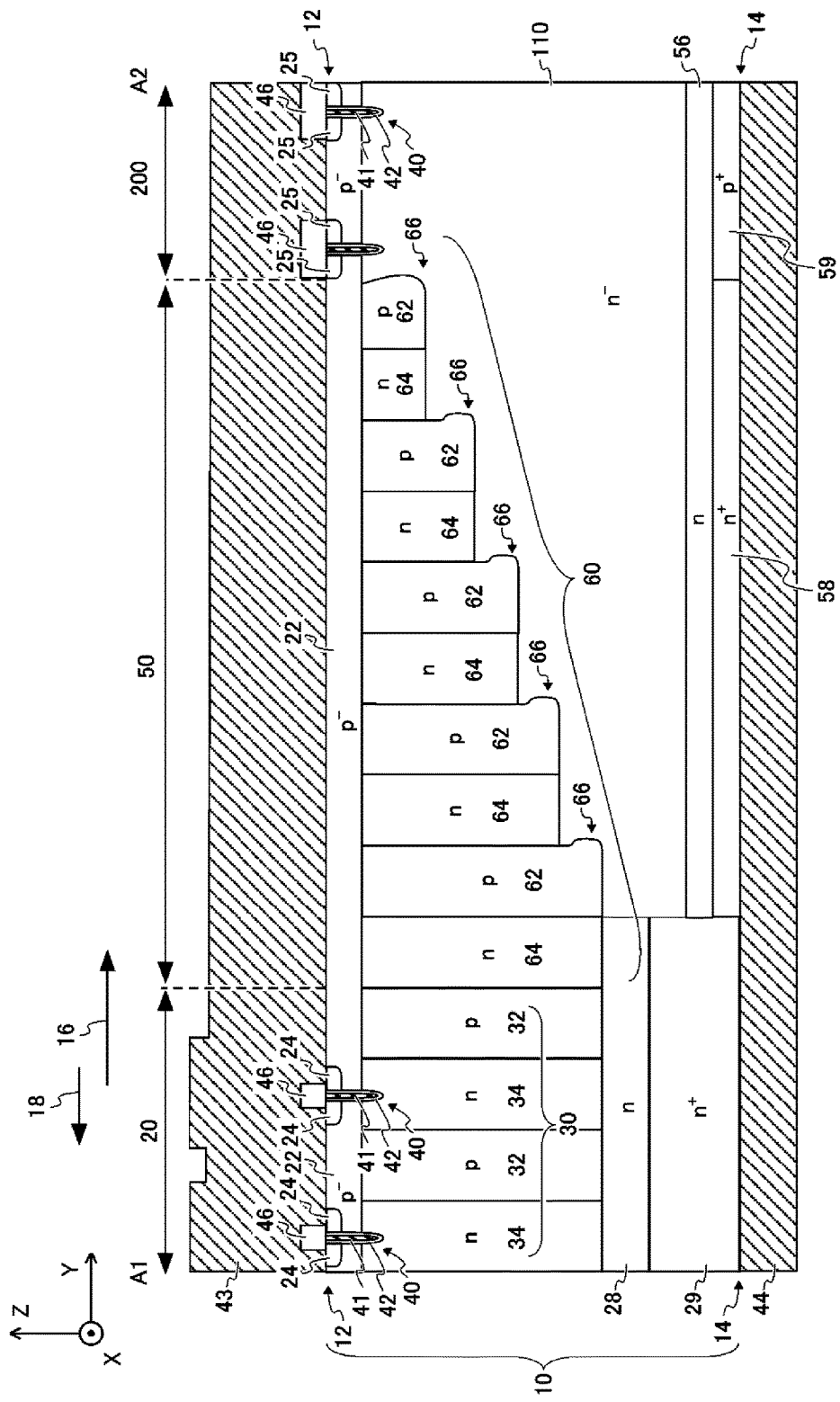
FIG. 14 is a schematic view illustrating a cross-section along A1-A2 in a seventh embodiment.

FIG. 14 is a schematic view illustrating the cross section along A1-A2 in a seventh embodiment. The IGBT 200 is the parallel device of the present example. The seventh embodiment is different from the first embodiment on this point. The IGBT 200 has a p$^+$-collector layer 59 under the FS layer 56. Also, the IGBT 200 has a gate trench 40 in the base region 22, similar to the SJ MOSFET 20, and has an n$^+$-type emitter region 25 instead of the source region 24.

However, the IGBT 200 of the present example does not have the repetitive structure 30 which is similar to that of the SJ MOSFET 20. Instead, the IGBT 200 of the present example has the n-type drift region 110. When a predetermined potential higher than that of the source electrode 43 (may be referred to as an emitter electrode) is applied to the drain electrode 44 (may be referred to as a collector electrode), and a positive pulse is applied to the gate electrode 42, a channel is formed in the base region 22. At this time, holes are implanted into the drift region 110 from the collector layer 59, and electrons are implanted from the emitter region 25. Thereby, conductivity modulation is generated in the drift region 110, and the drift region 110 is turned into a low resistance state. For that reason, a large electric current flows through the source electrode 43 from the drain electrode 44. In addition, the constitution of the present example may be combined with those of the second to sixth embodiments.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: one main surface, 14: other main surface, 16: outer direction, 18: inner direction, 20: SJ MOSFET, 22: base region, 24: source region, 25: emitter region, 26: surface region, 28: buffer region, 29: drain region, 30: repetitive structure, 32: p-type column, 34: n-type column, 36: first isolation trench, 38: second isolation trench, 40: gate trench, 41: gate insulating film, 42: gate electrode, 43: source electrode, 44: drain electrode, 46: interlayer insulating film, 50: boundary portion, 56: FS layer, 58: n-type layer, 59: collector layer, 60: repetitive structure, 62: p-type column, 63: depth, 64: n-type column, 65: depth, 66: protruding region, 81: insulating film, 82: electrode, 90: support substrate, 91: epitaxial layer, 92: region, 100: FWD, 110: drift region, 200: IGBT, 250: edge termination structure, 300: semiconductor device, 400: inverter apparatus

What is claimed is:
1. A semiconductor device, comprising:
a semiconductor substrate;
a super junction MOSFET having a repetitive structure of a first column including first conductivity-type impurities and a second column including second conductivity-type impurities, each of the first column and the second column being provided extending in a direction from one main surface toward the other main surface of the semiconductor substrate;
a parallel device having a drift region including second conductivity-type impurities, the parallel device being provided separately from the super junction MOSFET in the semiconductor substrate; and
a boundary portion located between the super junction MOSFET and the parallel device in the semiconductor substrate, wherein the boundary portion extends in a direction from the one main surface toward the other main surface, and has at least one third column having first conductivity-type impurities, and a depth of the third column is shallower than a depth of the first column and shallower than a depth of the second column.

2. The semiconductor device according to claim 1, wherein the boundary portion has a plurality of the third columns in different positions of the semiconductor substrate in an outer direction directed from the super junction MOSFET toward the parallel device, and the depth of the plurality of the third columns becomes gradually shallower toward the outer direction.

3. The semiconductor device according to claim 2, further comprising:

a fourth column having second conductivity-type impurities between the third columns adjacent to each other of the plurality of the third columns, wherein a concentration of the second conductivity-type impurities of the fourth column is equal to or greater than a concentration of the second conductivity-type impurities in the drift region, and a concentration of the first conductivity-type impurities in the plurality of the third columns is equal to or greater than the concentration of the second conductivity-type impurities in the drift region.

4. The semiconductor device according to claim 3, wherein a depth of the fourth column is smaller than the depth of the third column adjacent thereto in a reverse direction of the outer direction, and the third column has a protruding region protruding in the outer direction at a deepest portion of the third column.

5. The semiconductor device according to claim 4, wherein the protruding region does not contact the fourth column adjacent thereto in the outer direction.

6. The semiconductor device according to claim 3, wherein a depth of the fourth column is equal to the depth of the third column adjacent thereto in the outer direction.

7. The semiconductor device according to claim 3, wherein the boundary portion has two sets of the third column and the fourth column having the same depth consecutively in the outer direction at an end portion of the outer direction.

8. The semiconductor device according to claim 1, wherein the super junction MOSFET further includes a buffer region at the other main surface having second conductivity-type impurities, and an end portion of the buffer region at a side of the boundary portion extends beyond the first column and the second column in the SJ MOSFET which are closest to the boundary portion.

9. The semiconductor device according to claim 1, wherein the super junction MOSFET further includes:

a base region having first conductivity-type impurities, the base region being located on the repetitive structure of the first column and the second column;

a source region having second conductivity-type impurities, the source region including a portion of an outermost surface of the base region;

a source electrode provided on the base region, the source electrode being electrically connected to the source region, and;

a surface region having a concentration of second conductivity-type impurities lower than that of the source region, the surface region being provided in a region which is on the outermost surface of the base region and is different from the source region, and being electrically connected to the source electrode provided on the base region; and a first isolation trench extending downward from a portion of the surface region until it reaches a boundary between the second column and the first column adjacent to the second column.

10. The semiconductor device according to claim 9, wherein the boundary portion includes:

the base region provided extending from the super junction MOSFET;

the surface region provided extending from the super junction MOSFET; and a second isolation trench provided extending downward from a portion of the surface region until it reaches any of the third column, a fourth column, and a boundary of the third column and the fourth column adjacent to each other.

11. The semiconductor device according to claim 1, wherein the parallel device is either a freewheeling diode or an IGBT.

12. The semiconductor device according to claim 11, wherein the parallel device is the freewheeling diode, the semiconductor device further comprises:

the IGBT adjacent to the freewheeling diode in the outer direction directed from the super junction MOSFET toward the freewheeling diode; and an edge termination structure adjacent to the IGBT in the outer direction, wherein the super junction MOSFET, the boundary portion, the freewheeling diode, and the IGBT are provided in the semiconductor substrate, wherein the semiconductor substrate is a single substrate.

13. The semiconductor device according to claim 1, wherein the third column has a protruding region protruding in an outer direction at a deepest portion of the third column.

* * * * *